US011932713B2

(12) United States Patent
Aqad et al.

(10) Patent No.: US 11,932,713 B2
(45) Date of Patent: Mar. 19, 2024

(54) MONOMERS, POLYMERS AND LITHOGRAPHIC COMPOSITIONS COMPRISING SAME

(71) Applicant: Rohm and Haas Electronic Materials LLC, Marlborough, MA (US)

(72) Inventors: Emad Aqad, Marlborough, MA (US); James F. Cameron, Marlborough, MA (US); James W. Thackeray, Marlborough, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 16/236,883

(22) Filed: Dec. 31, 2018

(65) Prior Publication Data
US 2019/0202955 A1    Jul. 4, 2019

Related U.S. Application Data

(60) Provisional application No. 62/612,555, filed on Dec. 31, 2017.

(51) Int. Cl.
| | | |
|---|---|---|
| *G03F 7/38* | (2006.01) | |
| *C07F 11/00* | (2006.01) | |
| *C08F 230/04* | (2006.01) | |
| *C09D 133/04* | (2006.01) | |
| *C09D 133/14* | (2006.01) | |
| *C09D 143/00* | (2006.01) | |
| *G03F 7/004* | (2006.01) | |
| *G03F 7/038* | (2006.01) | |
| *G03F 7/039* | (2006.01) | |
| *G03F 7/09* | (2006.01) | |
| *G03F 7/11* | (2006.01) | |
| *G03F 7/16* | (2006.01) | |
| *G03F 7/20* | (2006.01) | |
| *G03F 7/32* | (2006.01) | |

(52) U.S. Cl.
CPC .......... *C08F 230/04* (2013.01); *C07F 11/00* (2013.01); *C09D 133/04* (2013.01); *C09D 133/14* (2013.01); *C09D 143/00* (2013.01); *G03F 7/0042* (2013.01); *G03F 7/038* (2013.01); *G03F 7/039* (2013.01); *G03F 7/091* (2013.01); *G03F 7/094* (2013.01); *G03F 7/11* (2013.01); *G03F 7/162* (2013.01); *G03F 7/168* (2013.01); *G03F 7/2004* (2013.01); *G03F 7/322* (2013.01); *G03F 7/38* (2013.01)

(58) Field of Classification Search
CPC .. C08F 230/00; C08F 230/04; C09D 133/142; C09D 133/04; C09D 143/00; C07F 1/00; C07F 11/00; G03F 7/322; G03F 7/2004; G03F 7/091; G03F 7/0042; G03F 7/039; G03F 7/094; G03F 7/38; G03F 7/038; G03F 7/11; G03F 7/162; G03F 7/168; G03F 7/16; G03F 7/20; G03F 7/32
See application file for complete search history.

(56) References Cited

U.S. PATENT DOCUMENTS

| | | | | |
|---|---|---|---|---|
| 3,808,108 | A * | 4/1974 | Herb et al. | H01L 21/00 438/945 |
| 4,434,098 | A * | 2/1984 | Detty | C07D 345/00 540/1 |
| 5,164,524 | A * | 11/1992 | Gedridge, Jr. | C07F 7/081 556/423 |
| 5,212,046 | A * | 5/1993 | Lamola | G03F 7/0045 430/270.1 |
| 5,264,246 | A * | 11/1993 | Ikeno | H01L 21/67023 438/782 |
| 5,989,776 | A | 11/1999 | Felter et al. | |
| 6,787,281 | B2 | 9/2004 | Tao et al. | |
| 10,781,276 | B2 | 9/2020 | Enomoto et al. | |
| 2002/0015916 | A1* | 2/2002 | Uenishi | G03F 7/0045 430/281.1 |
| 2004/0241574 | A1 | 12/2004 | Dai et al. | |
| 2006/0147836 | A1* | 7/2006 | Hatakeyama | G03F 7/0397 430/270.1 |
| 2008/0031931 | A1* | 2/2008 | Gunn | A61L 24/0015 424/448 |
| 2011/0020749 | A1 | 1/2011 | Ichikawa et al. | |
| 2011/0076626 | A1* | 3/2011 | Padmanaban | G03F 7/091 430/326 |
| 2013/0034708 | A1* | 2/2013 | Ryu | H01L 21/6715 428/212 |
| 2017/0168398 | A1* | 6/2017 | Zi | G03F 7/20 |

(Continued)

FOREIGN PATENT DOCUMENTS

| | | | |
|---|---|---|---|
| JP | 08088159 A | * | 4/1996 |
| JP | 2008163242 A | | 7/2008 |

(Continued)

OTHER PUBLICATIONS

Passarelli et al., "Organometallic carboxylate resists for extreme ultraviolet with high sensitivity", J. Micro/Nanolith. MEMS MOEMS vol. 154(4) 10 pages (Oct.-Dec. 2015).*

(Continued)

*Primary Examiner* — Martin J Angebranndt
(74) *Attorney, Agent, or Firm* — CANTOR COLBURN LLP

(57) ABSTRACT

New monomer and polymer materials that comprise one or more Te atoms. In one aspect, tellurium-containing monomers and polymers are provided that are useful for Extreme Ultraviolet Lithography.

17 Claims, No Drawings

(56) References Cited

U.S. PATENT DOCUMENTS

| | | | |
|---|---|---|---|
| 2017/0242336 A1* | 8/2017 | Kasahara | G03F 7/168 |
| 2017/0242338 A1* | 8/2017 | Hirano | G03F 7/162 |
| 2018/0267406 A1 | 9/2018 | Nagai et al. | |
| 2018/0273664 A1* | 9/2018 | Enomoto | C08F 220/303 |
| 2019/0161509 A1* | 5/2019 | Aqad | G03F 7/16 |
| 2019/0163055 A1* | 5/2019 | Aqad | G03F 7/0397 |
| 2019/0163058 A1* | 5/2019 | Aqad | C07C 309/06 |
| 2019/0243238 A1* | 8/2019 | Naito | G03F 7/039 |

FOREIGN PATENT DOCUMENTS

| | | | |
|---|---|---|---|
| JP | 2017207532 A | | 11/2017 |
| JP | 2018-199781 | * | 12/2018 |
| WO | 2017033943 A1 | | 3/2017 |
| WO | WO-2017057537 A1 | * | 4/2017 ......... C08F 220/302 |
| WO | 2017188450 A1 | | 11/2017 |
| WO | 2017188451 A1 | | 11/2017 |
| WO | 2018117167 | * | 6/2018 |
| WO | 2019006600 | * | 4/2019 |
| WO | 2019208761 | * | 10/2019 |

OTHER PUBLICATIONS

Singh et al., "Hydrotelluration of acetylenic esters Structural characterization of stereoisomers of methyl/ethyl-(aryltelluro) acrylates". RSC Advances vol. 5 pp. 58246-58254 (2015).*

Fallica et al., "Dynamic absorption coefficients of CAR and non-CAR resist at EUV", Proc. SPIE vol. 9776, article 977612, 10 pages (2016).*

Sekiguchi et al. "A study on enhancing EUV resist sensitivity", Proc SPIE vol. 10143 articles 1014322 8 pages (Mar. 2017).*

Machine translation of JP 2018-199781 (2018).*

Fukunaga et al., J. Photo. Polym. Sci. Tech., 2017, 30, 103-107—Not being supplied at this time.

Kudo, et al., "Chem Letters", 2011, 40, 762-764—Not being supplied at this time.

Kanda T. et al in J. Org. Chem. 1999, 64, 8161-8169.

* cited by examiner

MONOMERS, POLYMERS AND LITHOGRAPHIC COMPOSITIONS COMPRISING SAME

This Application claims the benefit of U.S. Provisional Application 62/612,555 filed on Dec. 31, 2017. The entire contents of these applications are incorporated herein by reference in their entirety.

FIELD

The present invention relates to new monomer and polymer materials that comprise one or more Te atoms. In one preferred aspect, tellurium-containing monomers and polymers are provided that are useful for photoresist and other coating compositions employed in extreme ultraviolet lithography.

BACKGROUND

Extreme ultraviolet lithography ("EUVL") is one of the leading technologies options to replace optical lithography for volume semiconductor manufacturing at feature sizes <20 nm. The extremely short wavelength (13.4 nm) is a key enabling factor for high resolution required at multiple technology generations. In addition, the overall system concept—scanning exposure, projection optics, mask format, and resist technology—is quite similar to that used for current optical technologies. Like previous lithography generations, EUVL consists of resist technology, exposure tool technology, and mask technology. The key challenges are EUV source power and throughput. Any improvement in EUV power source will directly impact the currently strict resist sensitivity specification. Indeed, a major issue in EUVL imaging is resist sensitivity, the lower the sensitivity, the greater the source power that is needed or the longer the exposure time that is required to fully expose the resist. The lower the power levels, the more noise affects the line edge roughness (LER) of the printed lines.

Various attempts have been made to alter the make-up of EUV photoresist compositions to improve performance of functional properties. Among other things, a variety of polymer materials have been reported. See US 20040241574 and U.S. Pat. No. 5,989,776. See also WO2017033943A1; WO2017188450; WO2017188451; Fukunaga et. al. J. Photo. Polym. Sci. Tech., 2017, 30, 103-107; Kudo et al., Chem. Letters, 2011, 40, 762-764.

Electronic device manufacturers continually seek increased resolution of a patterned photoresist image.

It would be desirable to have new photoresist compositions that could provide enhanced imaging capabilities, including new photoresist compositions useful for EUVL.

SUMMARY

We now provide new monomer and polymers that comprise one or more tellurium (Te) atoms. We also provide lithographic compositions including photoresist compositions and underlying coating compositions (such as antireflective or planarizing compositions) that comprise one or more of the present monomers or polymers.

In one preferred aspect, addition-type polymers are provided that comprise one or more repeat units that include one or more Te atoms. In another preferred aspect, polymers are provided that comprise one or more moieties pendant to a polymer backbone chain, where one or more pendant moieties comprise one or more Te atoms. In polymers of the invention, one or more Te atoms of the polymer are suitably either divalent or tetravalent.

In a preferred aspect, monomers are provided that comprise (a) one or more Te atoms; and (b) one or more unsaturated polymerizable groups, including one or more ethylenically polymerizable groups. The one or more Te atoms of such monomers are suitably either divalent or tetravalent.

Preferred monomers may further comprise one or more acid-cleavable groups, polar groups, and/or base reactive groups.

Suitable acid-cleavable groups include ester and acetal groups that can react during lithographic processing with photogenerated acid present in a photoresist or other composition layer. A variety of polar groups will be suitable including alkyl and aryl groups substituted with one or more moieties comprising one or more hetero atoms such as cyano, hydroxyl or epoxy. Suitable base reactive or acidic groups also may vary and include for example an acidic or base reactive group such as halogenated hydroxylalkyl including hexafluoroalcohol (HFA), carboxylic acid, sulfonic acid, sulfonamide, lactone or phenol.

The one or more polymerizable groups suitably may be ethylenically unsaturated groups such as optionally substituted acrylate, optionally substituted acrylamide, optionally substituted vinyl ether moiety, an optionally substituted non-cyclic vinyl group or a cyclic olefin moiety.

More particularly, in certain aspects, preferred monomers may comprise an acrylate moiety. Preferred acrylate monomers may comprise a structure corresponding to the following Formula (I):

wherein R is hydrogen or a non-hydrogen substituted such as optionally substituted $C_{1-16}$ alkyl including optionally substituted methyl; and P comprises one or more Te atoms.

In certain preferred aspects, P may comprise one or more acid-cleavable groups, polar groups and/or base reactive groups.

In certain aspects, preferred acrylate monomers include those that comprise a carbon or hetero aromatic (carbocyclic aryl or heteroaryl) or alicyclic (carbon alicyclic or heteroalicyclic) group, such as monomers that comprise a structure of the following Formula (IA):

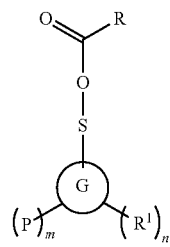

where in Formula (IA), R and each P is the same as defined in Formula (I) above; S is a linker such as a chemical bond or a chain having from 1 to 20 or more carbon and hetero atoms (N,O, S) which may be optionally substituted including to provide a quaternary carbon atom adjacent the depicted ester linkage;

each $R^1$ is the same or different non-hydrogen substituent and may comprise one or more acid-cleavable groups, polar groups, or base reactive groups, or optionally may comprise one or more alkyl groups;

m is an integer equal to 1 to the maximum valence permitted by G and typically m is an integer of 1, 2, 4, 5, 6, 7 or 8;

n is an integer equal to 0 (where no $R^1$ groups present) to the maximum valence permitted by G and typically m is an integer of 0, 1, 2, 3, 4, 5, 6, 7 or 8; and

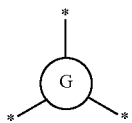

represents a monocyclic or polycyclic unsubstituted or, substituted $C_{6-30}$arylene group, or a group comprising one or more tellurophene heterocycles or a monocyclic or polycyclic unsubstituted or substituted $C_{3-30}$heteroarylene group, wherein "*" indicates a point of attachment to a neighboring group or atom.

In certain aspects, preferred acrylate monomers may comprise one or more carbocyclic aryl groups such as phenyl or naphthyl groups. Such preferred monomers include those that comprise a structure corresponding to the following Formula (IB):

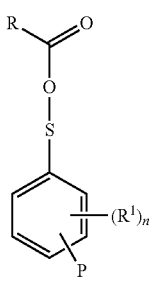

wherein in Formula (IB):

R is the same as defined in Formula (I) above;

S is a linker such as a chemical bond or a chain having from 1 to 20 or more carbon and hetero atoms (N,O, S) which may be optionally substituted including to provide a quaternary carbon atom adjacent the depicted ester linkage;

P comprises one or more Te atoms and optionally may further comprise one or more acid-cleavable groups, polar groups, or base reactive groups; and each $R^1$ is the same or different non-hydrogen substituent and may comprise one or more acid-cleavable groups, polar groups, or base reactive groups, or optionally may be comprise one or more alkyl groups; and n is an integer of 0 (where no $R^1$ groups are present) to 4, m is an integer of 1 to 4.

In certain preferred aspects, P or at least one $R^1$ group optionally comprises at least one acid labile, polar or base reactive group.

In certain aspects, preferred acrylate monomers may comprise one or more carbocyclic aryl groups where a Te atom is directly substituted (no other atoms interposed between Te and a carbocyclic aryl ring atom) to the carbocyclic aryl ring. For example, preferred are monomers that comprise a structure of the following Formula (IC):

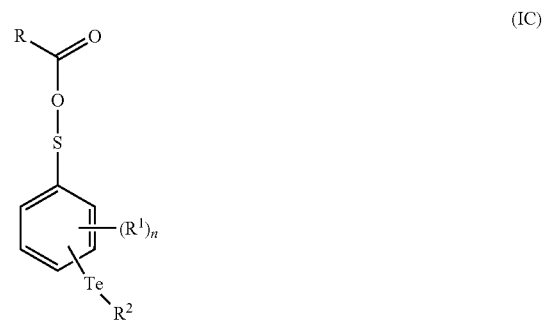

wherein in Formula (IC):

R and S are each the same is the same as defined in Formula (IB) above;

each $R^1$ is the same or different non-hydrogen substituent and may comprise one or more acid-cleavable groups, polar groups, and/or base reactive groups;

$R^2$ is a non-hydrogen substituent and optionally may comprise one or more acid-cleavable groups, polar groups, and/or base reactive groups; and n is an integer of 0 (where no $R^1$ groups are present) to 4.

In certain preferred embodiments of monomers of Formula (IC), at least one $R^1$ group or one $R^2$ group comprises at least one acid labile, polar or base reactive group.

In certain other aspects, preferred monomers may comprise a vinyl ether moiety. Preferred vinyl ether monomers may comprise a structure corresponding to the following Formula (II):

wherein in Formula (II) R and P are the same as defined in Formula (I) above.

In certain aspects, preferred vinyl ether monomers include those that comprise a carbon or hetero aromatic (carbocyclic aryl or heteroaryl) or alicyclic (carbon alicyclic or heteroalicyclic) group, such as monomers that comprise a structure of the following Formula (IIA):

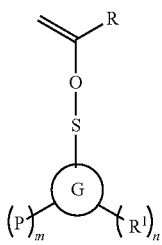

where in Formula (IIA), R, each P, S, each $R^1$, m and n are same as defined in Formula (IA) above; and

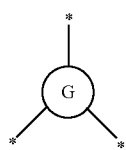

represents a monocyclic or polycyclic unsubstituted or, substituted $C_{6-30}$arylene group, or a group comprising one or more tellurophene heterocycles or a monocyclic or polycyclic unsubstituted or substituted $C_{3-30}$heteroarylene group, wherein "*" indicates a point of attachment to a neighboring group or atom.

Preferred vinyl ether monomers may comprise one or more carbocyclic aryl groups such as phenyl or naphthyl groups. Such preferred monomers include those that comprise a structure corresponding to the following Formula (IIB):

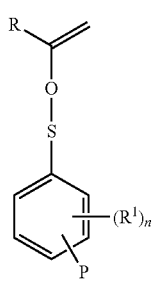

wherein in Formula (IIB) R, S, P, $R^1$ and n are the same as defined in Formula (IB) above.

Preferred vinyl ether monomers that comprise one or more carbocyclic aryl groups include those where a Te atom is directly substituted to the carbocyclic aryl ring. For example, preferred are monomers that comprise a structure of the following Formula (IIC):

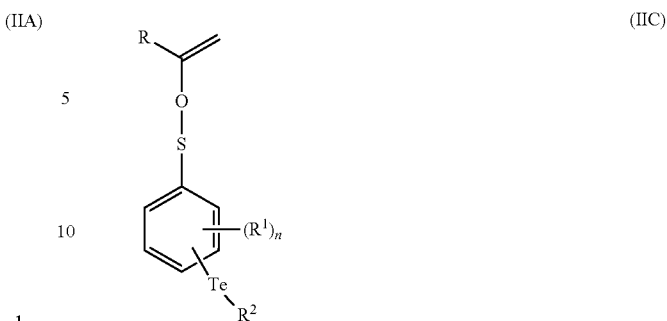

wherein in Formula (IIC) R, S, $R^1$, $R^2$ and n are the same as defined in Formula (IC) above.

In certain other aspects, preferred monomers may comprise a vinyl moiety and suitably may comprise a structure corresponding to the following Formula (III):

where in Formula (III) R and P are the same as defined in Formula (I) above.

In certain aspects, preferred vinyl monomers include those that comprise a carbon or hetero aromatic (carbocyclic aryl or heteroaryl) or alicyclic (carbon alicyclic or heteroalicyclic) group, such as monomers that comprise a structure of the following Formula (IIIA):

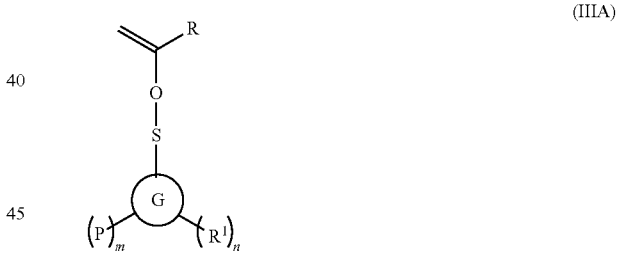

where in Formula (IIIA), R, each P, S, each $R^1$, m and n are same as defined in Formula (IA) above; and

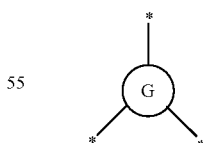

represents a monocyclic or polycyclic unsubstituted or, substituted $C_{6-30}$arylene group, or a group comprising one or more tellurophene heterocycles or a monocyclic or polycyclic unsubstituted or substituted $C_{3-30}$heteroarylene group, wherein "*" indicates a point of attachment to a neighboring group or atom.

In certain aspects, preferred vinyl monomers may comprise one or more carbocyclic aryl groups such as phenyl or naphthyl groups. Such preferred monomers include those that comprise a structure corresponding to the following Formula (IIIB):

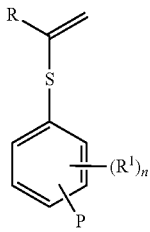

(IIIB)

where in Formula (IIIA), R, P, R¹ and n are the same as defined in Formula (IB) above.

Preferred vinyl monomers that comprise one or more carbocyclic aryl groups include those where a Te atom is directly substituted to the carbocyclic aryl ring. For example, preferred are monomers that comprise a structure of the following Formula (IIIC):

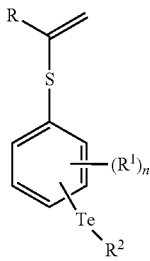

(IIIC)

wherein in Formula (IIIC) R, S, R¹, R² and n are the same as defined in Formula (IC) above.

In a further preferred, cyclic olefin monomers are provided that comprise one or more Te atoms. As referred to herein, a cyclic olefin is a non-aromatic ring structure (for example 5 to about 20 ring atoms, with 5 or 6 ring atoms preferred in certain embodiments) that has at least one endocyclic carbon-carbon single endocyclic multiple bond. In certain aspects, preferred cyclic olefin monomers include those having a structure of the following Formula (IV):

(IV)

wherein in Formula (IV):

P comprises one or more Te atoms;

each R¹ is the same or different non-hydrogen substituent and may comprise one or more acid-cleavable groups, polar groups, or base reactive groups, or optionally may comprise one or more alkyl groups; and n is an integer equal to 0 (where no R¹ groups are present) to the maximum valence permitted by the alicyclic ring and typically n is 0, 1, 2, 3, 4, or 5. In the above Formula (IV), the depicted ring suture may be a variety of structures, including having from 5 to about 20 ring atoms in a single, fused or linked ring structure, and in certain embodiments 5 or 6 ring atoms may be preferred. The ring containing the depicted carbon-carbon double bond in Formula (IV) is non-aromatic, although one or more aromatic rings may be covalently linked (including fused) to the alicyclic (non-aromatic) ring.

In a yet further preferred aspect, monomers are provided that comprise one or more Te atoms and one or more lactone functionalities. For instance, in the above Formulae (I), (IA), (IB), (IC), (II), (IIA), (IIB), (IIC), (III), (IIIA), (IIIB), (IIIC) and (IV) any P, R¹ or R² group may comprise one or more lactone moieties, such as a group of one of the following structures (where the wavy line indicates a covalent bond link to the monomer):

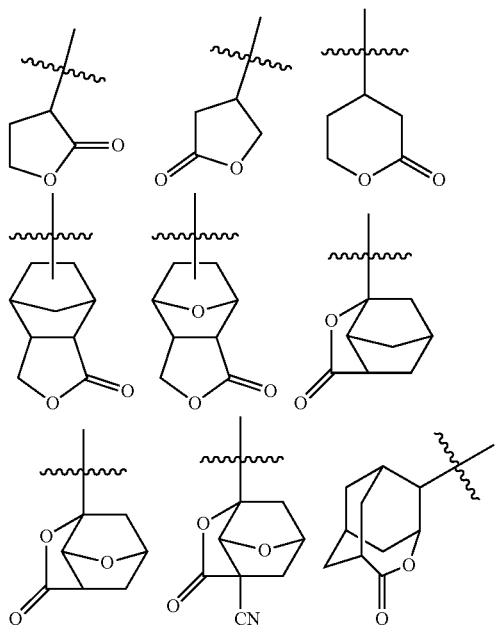

Polymers also are provided that comprise one or more reacted Te-monomers as disclosed herein, including one or more reacted monomers of any one of Formulae (I), (IA), (IB), (IC), (II), (IIA), (IIB), (IIC), (III), (IIIA), (IIIB), (IIIC) or (IV) above.

Preferred photoresists of the invention may comprise one or more acid generator compounds and a polymer component that comprises one or more Te-polymers as disclosed herein. The present photoresist suitably may be positive-acting or negative-acting.

A positive-acting photoresist suitably may comprise a component that comprises acid-labile groups as disclosed herein. The acid-labile groups may be present on a polymer that contains one or more Te atoms (a Te-polymer) and/or acid labile groups may present on another photoresist component, such as another resist resin that does not comprise Te-atoms.

A negative-acting photoresist suitably may comprise a crosslinker component, either as a separate composition or as a covalently linked portion of a resist component such as a Te-polymer. Suitable photoresist crosslinkers include the amine-based materials discussed below as crosslinker for an underlayer composition.

Underlayer compositions also are provided that may be utilized where a photoresist is coated above a layer of the underlayer composition. The present underlayer compositions comprise one or more Te polymers as disclosed herein and optionally may comprise one or more additional components such as a crosslinker and acid or acid generator compound. Preferably, an underlayer coating composition may be a cross-linked organic film and preferably may have a substantially reduced thickness. In certain preferred embodiments, the underlayer composition film layer dried thickness is about 200 Å or less, or about 100 Å or less of about 90 Å or less, of about 80 Å or less, of about 70 Å or less, of about 60 Å or less, or of about 50 Å or less.

In one aspect, methods are provided that comprise applying on a substrate a layer of an underlayer composition that includes one or more Te polymers as disclosed; and applying a layer of a photoresist composition above the underlayer coating composition layer.

Methods are also provided for forming relief images of photoresist compositions of the invention (including patterned lines with sub sub-50 nm or sub-20 nm dimensions). Such methods may comprise, for example: a) applying a coating layer of a photoresist of the invention on a substrate; b) exposing the photoresist composition layer to activating radiation including EUV; and c) developing the exposed photoresist composition coating layer.

Substrates such as a microelectronic wafer also are provided having coated thereon a photoresist composition of the invention. Electronic devices formed by the disclosed methods are also provided, Other aspects of the invention are discussed infra.

DETAILED DESCRIPTION

The term Te-polymer refers to a polymer as disclosed herein that comprises one or more Te atoms.

As discussed above, in one preferred aspect, addition-type polymers are provided that comprise one or more repeat nits that include one or more Te atoms. Addition polymers as referred to herein are formed by addition polymerization such as free-radical, cationic, anionic or coordination polymerization. As referred to herein, addition polymers can form through a reaction where a small molecule side product (e.g. $H_2O$) or MeOH) is not produced by the reaction and is distinguished from a condensation-type polymerization reaction. Polymerization of preferred monomers of the above Formulae (I), (IA), (IB), (IC), (II), (IIA), (IIB), (IIC) (III), (IIIA), (IIIB), (IIIC) and (IV) can provide addition polymers. In certain preferred aspects, can addition polymer may be formed by any of free radical polymerization, Nitroxide Mediated Polymerization (NMP), Atom transfer radical polymerization (ATRP), Reversible addition-fragmentation chain transfer (RAFT) polymerization, living anion polymerization (LAP) and/or atom transfer polymerization (ATP).

As also discussed, in another preferred aspect, polymers are provided that comprise one or more moieties pendant to a polymer backbone chain, where one or more pendant moieties comprise one or more Te atoms. Particularly preferred polymers may comprise such pendant Te-moieties but without any Te atoms along the polymer backbone. Polymerization of preferred monomers of the above Formulae (I), (IA), (IB), (IC), (II), (IIA), (IIB), (IIC) (III), (IIIA), (IIIB), (IIIC) and (IV) can provide such pendant Te-containing moieties.

As referred to herein, a Te-containing moiety will be pendant to a polymer chain where one or more Te atoms of the moiety is spaced from the polymer backbone by any of a number of groups including for example alkyl (alkylene); a ring group comprising carbon atoms; and and/or hetero atoms such as oxygen or optionally substituted sulfur (e.g. $S(O)$, $S(O)_2$), in a chain that comprises 1 or more atoms (including carbon atoms), generally 1, 2, 3, 4, 5, 6, 7, 8, 9 or 10 atoms (including carbon atoms), interposed between the polymer backbone and the reactive nitrogen-containing moiety.

As understood, the term polymer backbone refers to the series of covalently bonded atoms that together create the continuous linear chain of the polymer. In poly(acrylate) or poly(alkylacrylate) (such as poly(methacrylate) resins), a pendant Te atom can be spaced from the polymerized acrylate carboxy (—$CH_2$—CH(COO—)—) moiety or alkylacrylate carboxy (—$CH_2$—C(alkyl)(COO—)—) moiety by 1 or more atoms (including carbon atoms), generally 1, 2, 3, 4, 5, 6, 7, 8, 9 or 10 atoms (including carbon atoms).

In certain preferred aspects, 1, 2, 3, 4 or 5 optionally substituted carbon atoms (spacer group) may be interposed between a polymerized acrylate or alkylacrylate (such as methacrylate) polymer backbone moiety and a Te atom of a pendant Te-containing moiety.

In the above Formulae (I), (IA), (IB), (IC), (II), (IIA), (IIB), (IIC) (III), (IIIA), (IIIB), (IIIC) and (IV) suitable non-hydrogen substituents may be e.g. halo (F, Cl, Br or I); cynano, nitro, hydroxy, optionally substituted C1-20alkyl, optionally substituted C1-20alkoxy, such as optionally substituted alkyl (e.g. optionally substituted C1-10 alkyl), optionally substituted alkenyl or alkynyl preferably having 2 to about 20 carbon atoms such as such as allyl; optionally substituted ketones preferably having 1 to about 20 carbon atoms; optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; optionally substituted carboxy preferably have 1 to about 20 carbon atoms (which includes groups such as —COOR' where R' is H or $C_{1-8}$alkyl, including esters that are substantially non-reactive with photoacid); optionally substituted alkaryl such as optionally substituted benzyl, optionally substituted carbocyclic aryl such as optionally substituted phenyl, naphthyl, acenaphthyl, or optionally substituted heteroalicyclic or heteroaromatic group such as pyridyl, furanyl, pyrrole, thiophene, furan, imidazole, pyrazole, oxazole, isoxazole, thiazole, isothiazole, triazole, furanzan, oxadiazole, thiadiazole, dithiazole, terazole, pyran, thiopyran, diazine, oxazine, thiazine, dioxine, dithine, and triazine and polyaromatic groups containing one or more of such moieties.

As referred to herein, the term "arylene group" refers to a functional group having a valence of at least two obtained by removal of two hydrogens in an aromatic ring, optionally substituted with one or more substituents where indicated, provided that the valence of the arylene group is not exceeded.

As referred to herein, the term "heteroarylene group" refers to a functional group having a valence of at least two obtained by removal of two hydrogens in a heteroaromatic ring, optionally substituted with one or more substituents where indicated, provided that the valence of the heteroarylene group is not exceeded.

As discussed, groups of the above formulae may be suitably substituted at available positions by one or more acid-labile groups. Suitable acid-labile groups may be a variety of moieties, including acid-labile esters and acetals such as optionally substituted ethylcyclopentyl ester, methyladamantyl ester, ethyl adamantyl ester, t-butylester, phenyl ester, naphthyl ester and others. In certain preferred aspects, a Te-polymer of the invention will contain 1 or 2 covalently linked acid-labile groups. As referred to herein, acid-labile moieties or groups (including acid-labile esters and acetals) undergo reaction in the presence of generated acid (from an acid generator compound in a resist) during typical lithographic processing, including any post-radiation exposure thermal exposure. Acid-labile groups as referred to herein also may be referred to as photoacid-labile groups.

The present Te-containing monomers and polymers can be readily prepared. See, for instance, the syntheses set forth in the examples, which follow.

Specifically monomer compounds of the invention include the following:

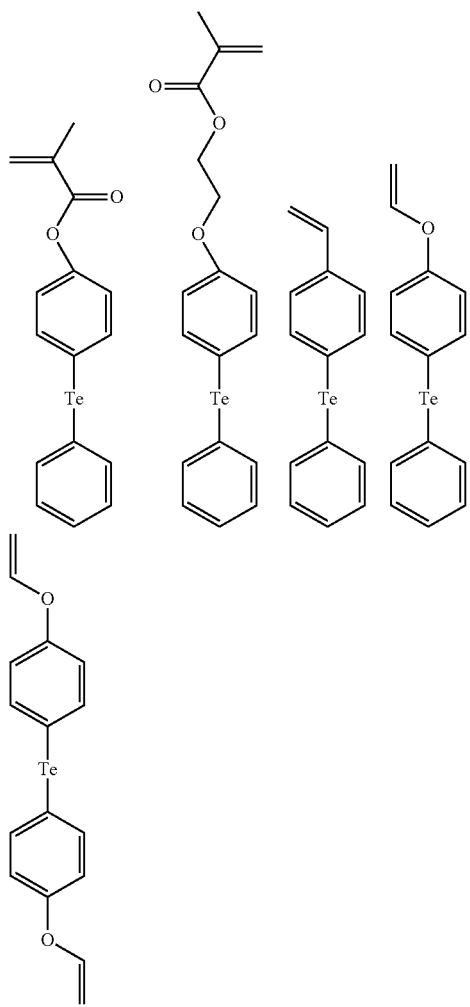

As discussed, monomers ay be preferred that comprise an acidic or base reactive group such as an alcohol group including halogenated alcohol such as fluorinated alcohols e.g. hexaflurolalcohol (HFA or hexafluoro-2-propylalcohol), carboxylic acid group, sulfonic acid group, sulfonamide group or phenolic group. Specifically preferred monomers that comprise a phenolic group include the following:

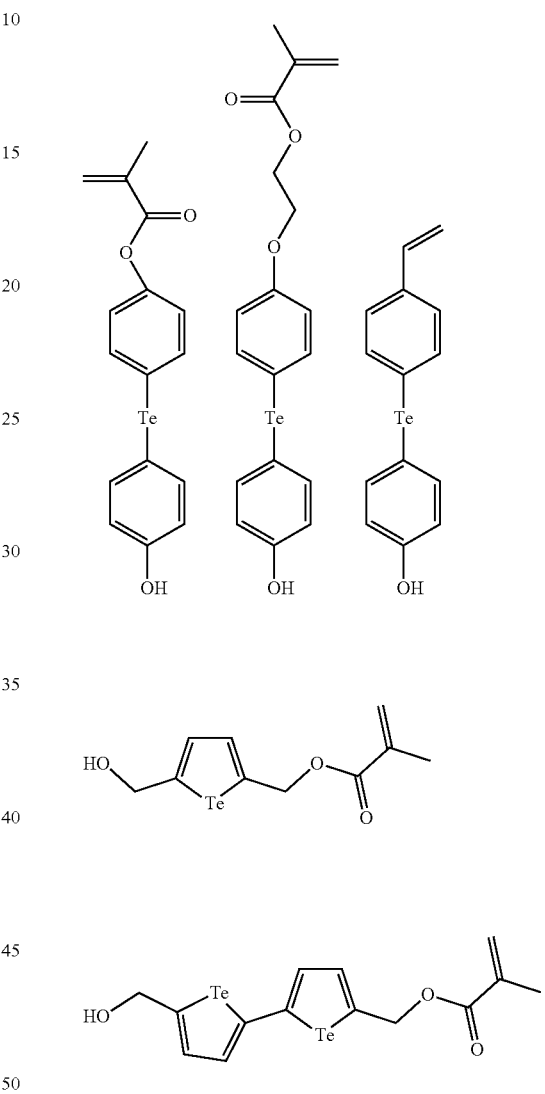

Further preferred monomers that comprise alcohol (including naphthol), carboxylic acid and halogenated alcohol substitution include the following:

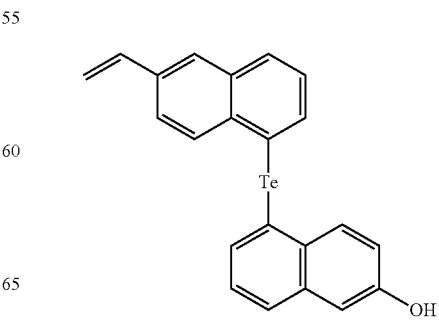

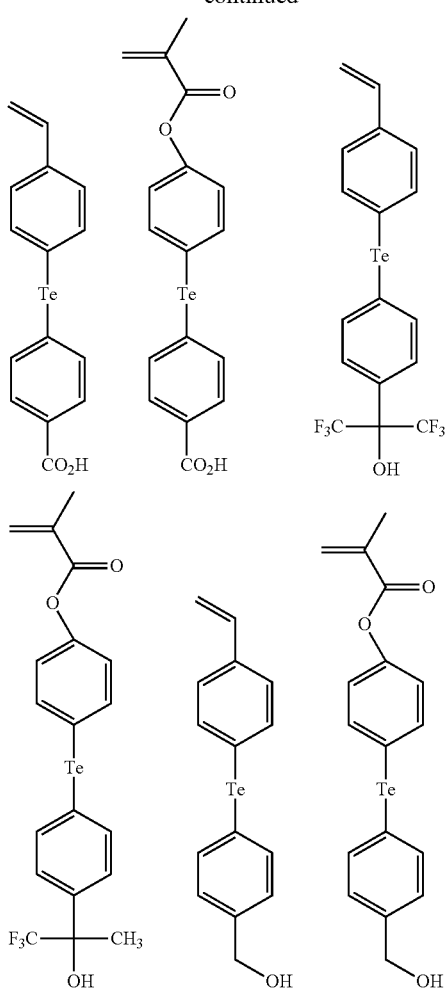
As discussed, compounds comprising one or more lactone groups also may be preferred such as the following:
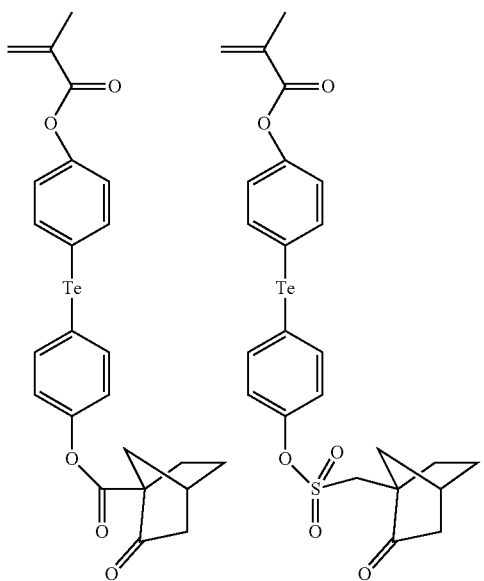
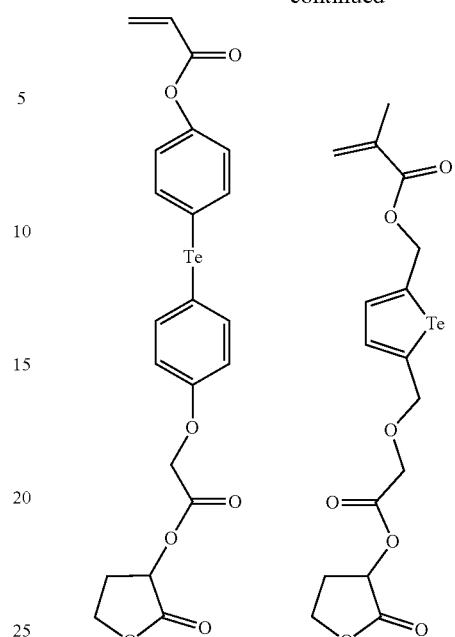
Compounds that comprise one or more epoxy groups also may be preferred:
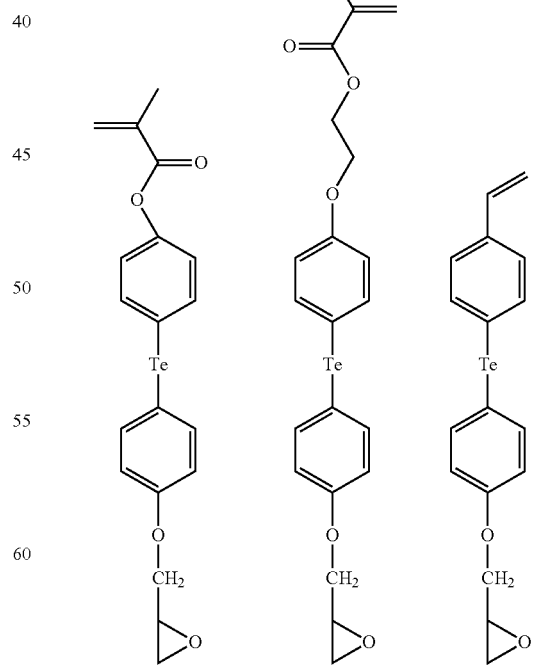

Preferred cyclic olefin monomers include the following:
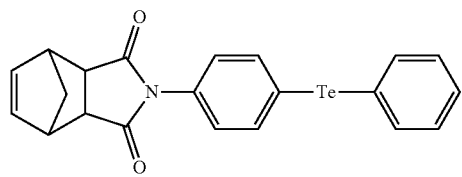
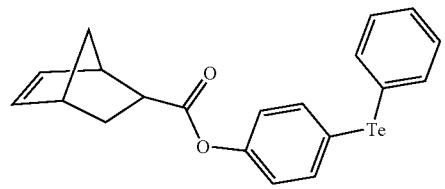
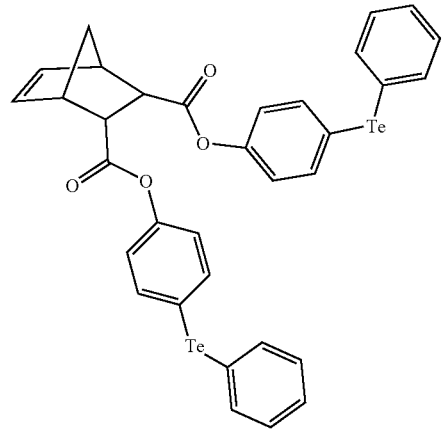
Preferred compounds that comprise one or more acid labile groups include the following:
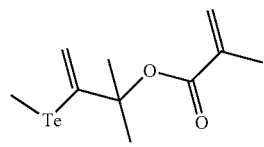
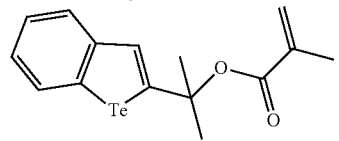
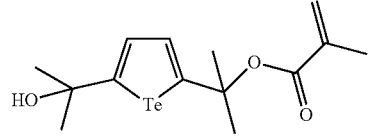
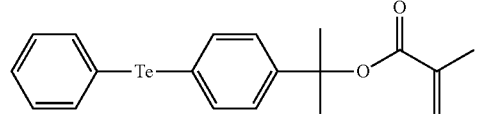
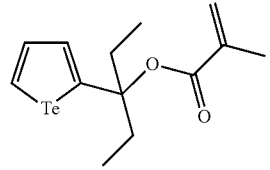
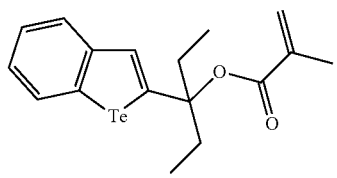
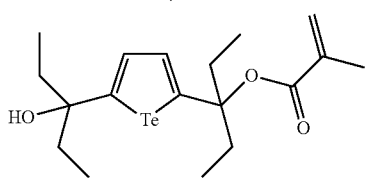
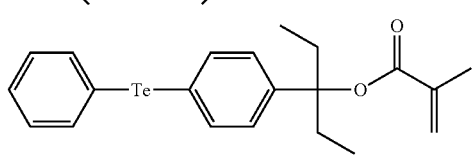
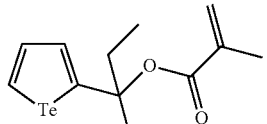
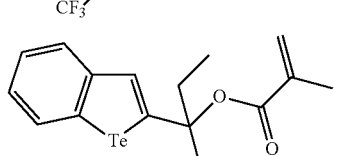
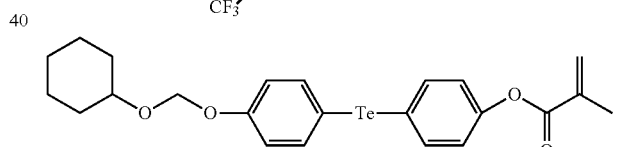
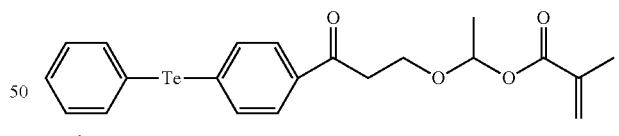
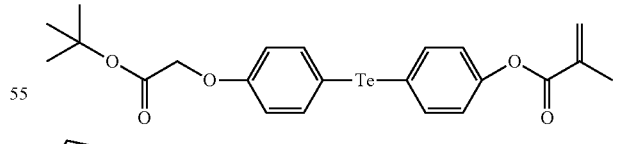
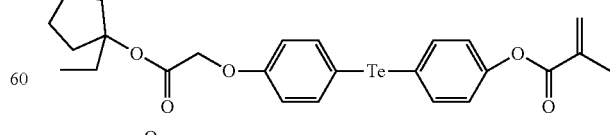
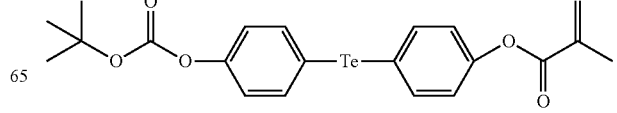

-continued
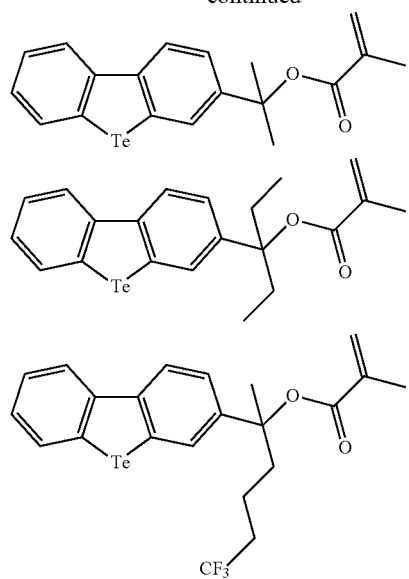
Preferred polymers include the following:
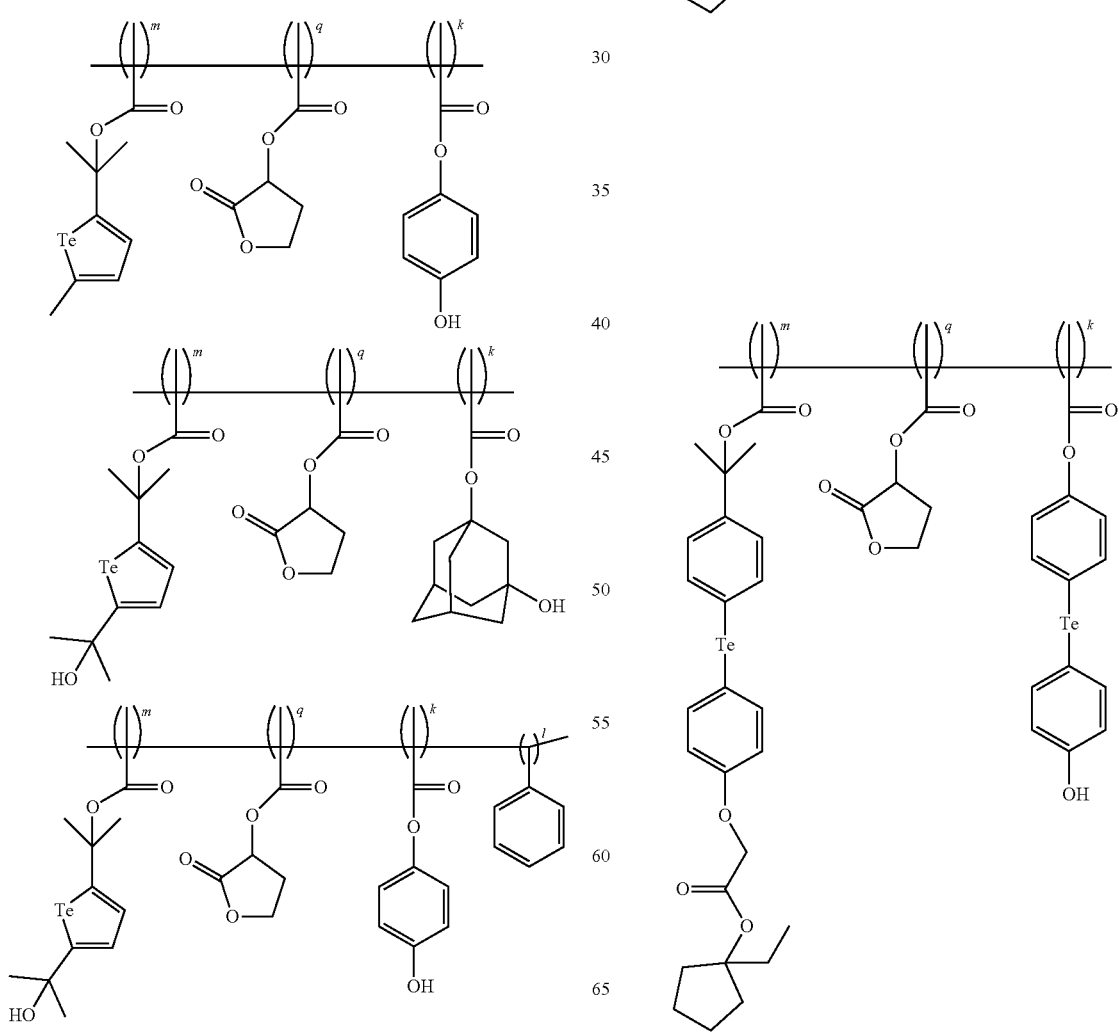
-continued
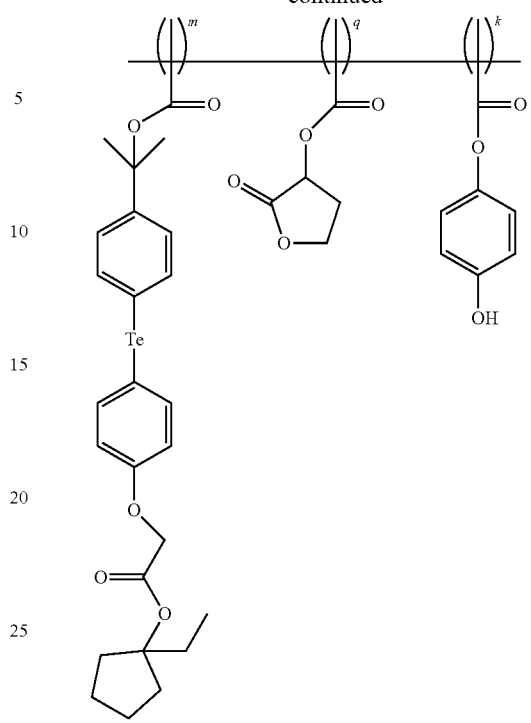

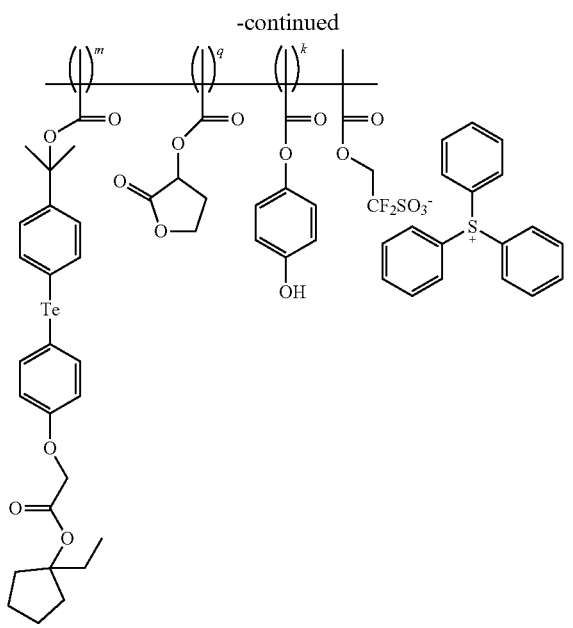

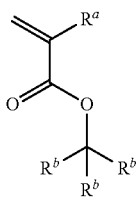
(V)

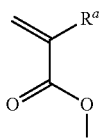
(VI)

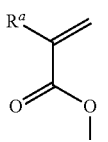
(VII)

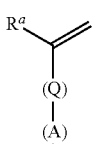
(VIII)

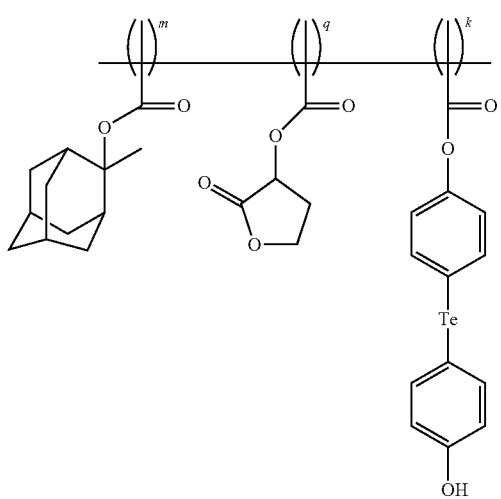

Photoresist Compositions

As discussed above, polymers as disclosed herein are useful in photoresist compositions, including both positive-acting and negative-acting chemically amplified resist compositions.

The photoresists of the invention typically comprise a polymer as disclosed herein and one or more photoacid generator compounds.

Polymers of the invention may comprise a variety of repeat units that may or may not comprise one or more Te atoms.

For instance, preferred additional monomers used for the formation of the present polymers include: an acid-labile monomer having the below formula (V), a lactone-containing monomer of the formula (VI), a base-soluble monomer of formula (VII) for adjusting dissolution rate in alkaline developer, and a photoacid-generating monomer of the formula (VIII), or a combination comprising at least one of the foregoing monomers:

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the photoacid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-labile monomers include but are not limited to:

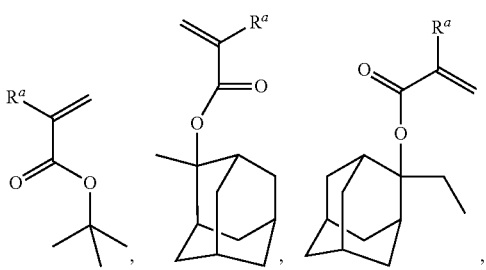

-continued

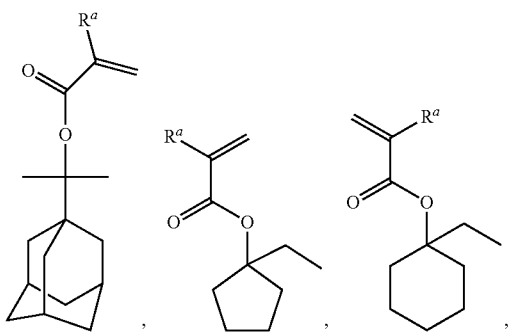

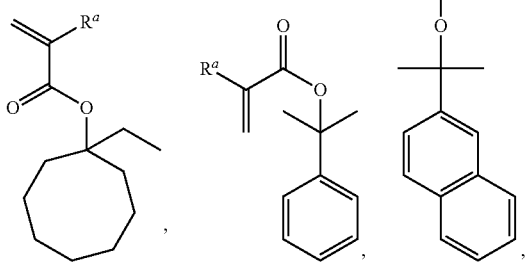

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

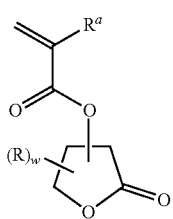

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

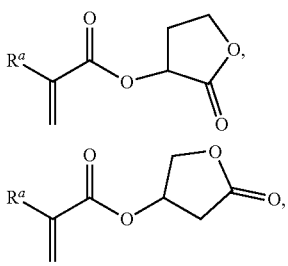

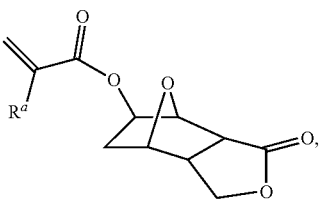

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

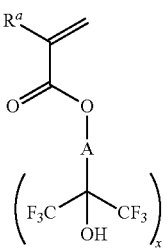

(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

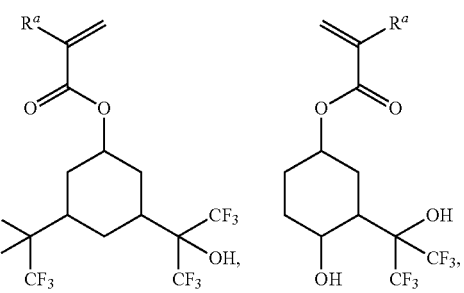

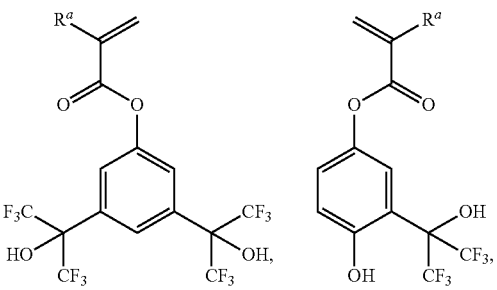

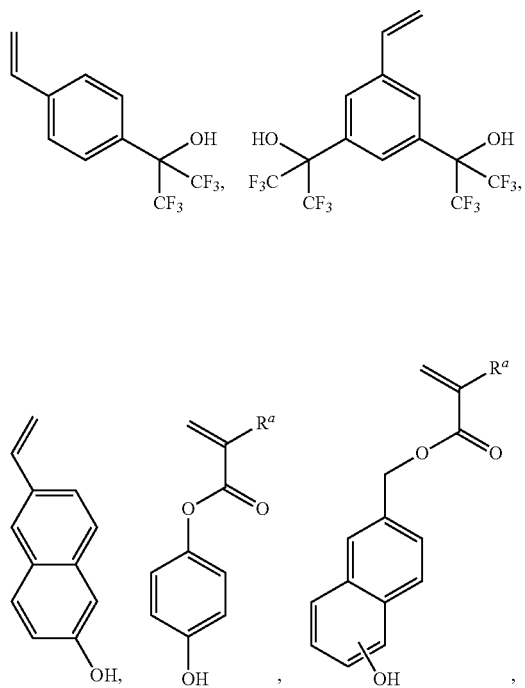

or a combination comprising at least one of the foregoing, wherein $R^a$ is H, F, —CN, $C_{1-6}$ alkyl, or $C_{1-6}$ fluoroalkyl.

Preferred photoacid generating monomer include those of the formulae (XI) or (XII):

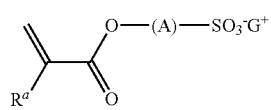

(XI)

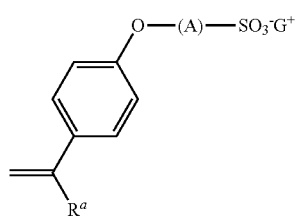

(XII)

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[(C$(R^1)_2)_xC(\!=\!O)O]_b$—$C((R^2)_2)_y(CF_2)_z$-group, or an o-, m- or p-substituted —$C_6F_4$-group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred photoacid generating monomers include:

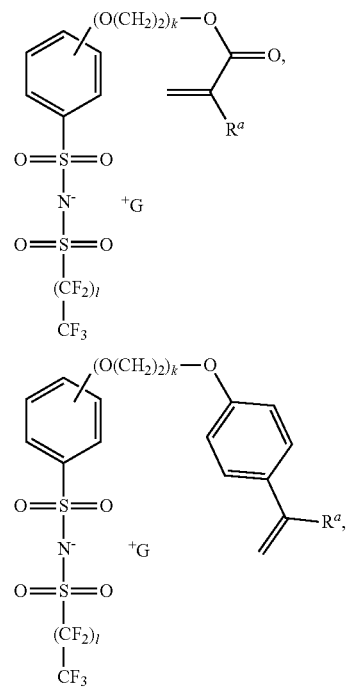

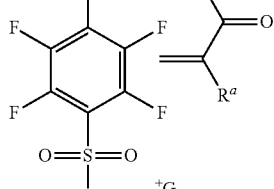

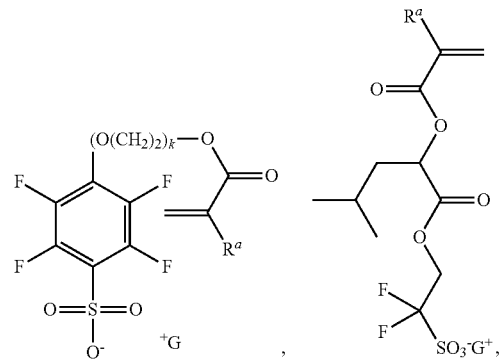

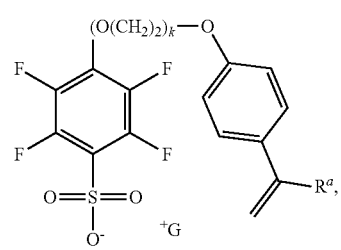

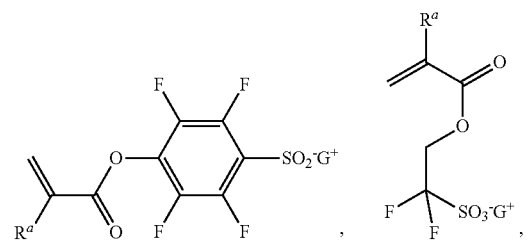

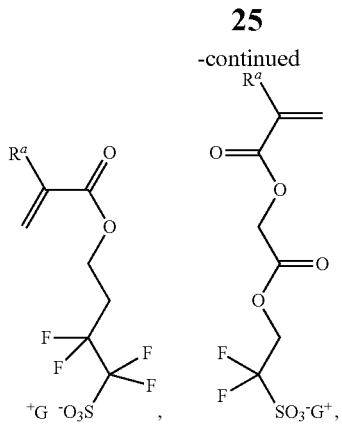

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation.

Preferred photoacid-generating monomers may include sulfonium or iodonium cation. Preferably, in formula (IV), $G^+$ is of the formula (XIII):

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, and a is 2 or 3, wherein when X is I, a is 2, or when X is S, a is 3.

Exemplary acid generating monomers include those having the formulas:

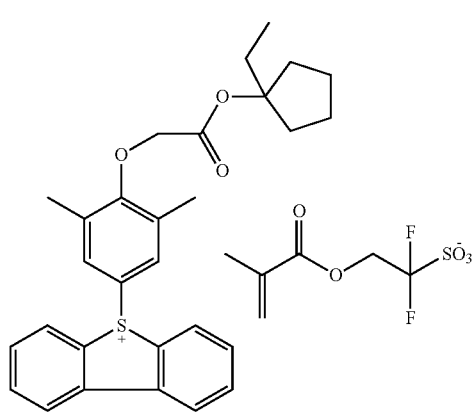

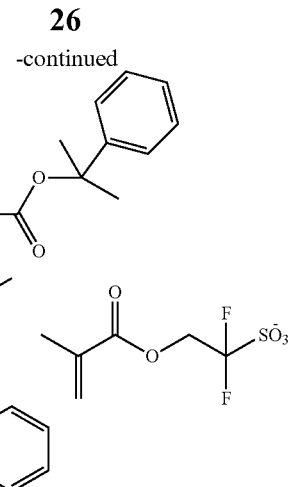

wherein $R^a$ is H, F, —CN, $C_{1-6}$ alkyl, or $C_{1-6}$ fluoroalkyl.

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Te-polymers for use in photoresists and underlayer compositions of the invention may suitably vary widely in molecular weight and polydispersity. Suitable polymers include those that have a weight average $M_w$ of from about 500 or 1,000 to about 50,000, more typically about 2,000 to about 30,000 with a molecular weight distribution of about 3 or less, more typically a molecular weight distribution of about 2 or less. Te-polymers of other molecular weights and molecular weight distributions also will be suitable.

Photoresists of the invention also may contain other materials. For example, other optional additives include actinic and contrast dyes, anti-striation agents, plasticizers, speed enhancers, sensitizers, photodestroyable bases etc. Such optional additives typically will be present in minor concentration in a photoresist composition.

Inclusion of base materials, preferably the carboxylate or sulfonate salts of photo-decomposable cations, provides a mechanism for neutralization of acid from the acid decomposable groups, and limits the diffusion of the photogenerated acid, to thereby provide improved contrast in the photoresist.

Photo-destroyable bases include photo-decomposable cations, and preferably those also useful for preparing acid generator compounds, paired with an anion of a weak (pKa>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, 1,1',1"-nitrilotripropan-2-ol, 1,1',1",1"'-(ethane-1,2-diylbis(azanetriyl))tetrapropan-2-ol; aryl amines such as diphenylamine, triphenylamine, aminophenol, and 2-(4-aminophenyl)-2-(4-hydroxyphenyl)propane, Troger's base, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Such photoresists may include the copolymer in an amount of 50 to 99 wt %, specifically 55 to 95 wt %, more specifically 60 to 90 wt %, and still more specifically 65 to 90 based on the total weight of solids. The photo-destroyable base if utilized may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 30 wt %, based on the total weight of solids and solvent. The acid generator compound(s) should be present in an amount sufficient to enable generation of a latent image in a coating layer of the resist. More specifically, the one or more acid generator compounds will suitably be present in an amount of from about 1 to 50 weight percent of total solids of a resist. It will be understood that the solids includes copolymer, photo-destroyable base, quencher, surfactant, any added PAG, and any optional additives, exclusive of solvent.

Underlayer Compositions

As discussed above, underlayer coating compositions are also provided that comprise one or more Te-polymers as disclosed herein.

In certain embodiments, an underlayer coating composition of the invention also may comprise a crosslinker in addition to or as a component (i.e. covalently linked) of a Te-polymer. For example, underlayer coating compositions may include amine-based crosslinkers such as melamine materials, including melamine resins such as manufactured by Cytec Industries and sold under the tradename of Cymel 300, 301, 303, 350, 370, 380, 1116 and 1130; glycolurils including those glycolurils available from Cytec Industries; and benzoquanamines and urea-based materials including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Coating compositions of the invention, particularly for reflection control applications, also may contain additional dye compounds that absorb radiation used to expose an overcoated photoresist layer.

Underlayer coating compositions of the invention also may contain other materials such as one or more acid generator compounds, including one or more thermal acid generators and/or photoacid generators. Suitable photoacid generator for use in an underlayer coating composition include photoacid generators disclosed herein for an overcoated photoresist composition. See U.S. Pat. No. 6,261,743 for a discussion of such use of a photoacid generator in an underlying coating composition.

To make a liquid underlayer coating composition, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone.

The concentration of the dry components (all coating composition expect solvent) in the solvent will depend on several factors such as the method of application. In general, the solid content of an underlayer coating composition varies from about 0.1 to 20 weight percent of the total weight of the coating composition, preferably the solid content varies from about 0.1 to 10 weight of the coating composition.

Lithographic Processing

A coated substrate may be formed from a photoresist containing one or more Te-polymers as disclosed herein and typically acid generator compound(s) which should be present in an amount sufficient to enable generation of a latent image in a coating layer of the resist and acid generator compound. Such a coated substrate includes: (a) a substrate having one or more layers to be patterned on a surface thereof; and (b) a layer of the photoresist composition including the acid generator compound over the one or more layers to be patterned. For EUV or e beam imaging, photoresists may suitably have relatively higher content of acid generator compound(s), e.g. where the one or more acid generator compounds comprise 5 to 10 to about 65 weight percent of total solids of the resist. Typically, lesser amounts of the photoactive component will be suitable for chemically amplified resists.

The photoresists of the invention are generally prepared following known procedures with the exception that one or more Te-polymers of the invention are included in the photoresist and in certain aspects are substituted for prior photoactive compounds used in the formulation of such photoresists. The photoresists of the invention can be used in accordance with known procedures.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including on a surface of the substrate; (b) patternwise exposing the photoresist composition layer to activating radiation; and (c) developing the exposed photoresist composition layer to provide a resist relief image.

If employed, an underlayer coating composition of the invention is applied as a coating layer to a substrate by any of a variety of methods such as spin coating. The coating composition in general is applied on a substrate with a dried layer thickness of between about 0.001 and 0.5 µm, including 0.002 and 0.01 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed.

In certain aspects, including EUV imaging, the underlayer coating composition may be suitably applied over a hardmask layer.

Preferably an applied underlayer coating layer is cured before a photoresist composition is applied over the underlayer coating composition. Cure conditions will vary with the components of the underlayer coating composition. Particularly the cure temperature will depend on the specific acid or acid (e.g. thermal) generator that is employed in the coating composition. Typical cure conditions are from about 60° C. to 225° C. for about 0.5 to 5 minutes. Cure conditions preferably render the coating composition coating layer substantially insoluble to the photoresist solvent as well the developer solution to be used.

After such curing, a photoresist can be applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. A pattern forms by developing.

Additionally, for positive resists, unexposed regions can be selectively removed by treatment with a suitable nonpolar solvent for negative tone development. See U.S. 2011/0294069 for suitable procedures for negative tone development of positive photoresists. Typical nonpolar solvents for negative tone development are organic developers, such as a solvent chosen from ketones, esters, hydrocarbons, and mixtures thereof, e.g. acetone, 2-hexanone, methyl acetate, butyl acetate, and terahydrofuran.

The photoresist may, when used in one or more such a pattern-forming processes, be used to fabricate electronic and optoelectronic devices such as memory devices, processor chips (CPU's), graphics chips, and other such devices.

The following examples are illustrative of the invention.

Examples 1-3: Monomers Syntheses

Example 1: M1 Synthesis

The reaction for the synthesis of monomer M1 is shown in Scheme 1 below. The synthesis of tellurophene derivative 1 is described in Ahmad, Sohail et al, Journal of Organic Chemistry, 80(8), 3880-3890; 2015 and Ahmad, Sohail et al, RSC Advances, 4(7), 3171-3180; 2014. A reaction flask is charged with a solution of 2,2'-(tellurophene-2,5-diyl)bis (propan-2-ol) (compound 1, 15.0 g. 50.7 mmol) in 150 mL of methylene chloride. The solution is cooled to 0° C. Methacryloyl chloride (3.53 g, 33.8 mmol) and triethylamine (3.54 g, 35.0 mmol) are added to the reaction flask, and the mixture is stirred at room temperature for 16 h. The organic phase is washed with water (3×100 mL), and the solvent is completely removed under reduced pressure. The crude material is purified by silica-gel column chromatography. The solvent fractions that contain the product are collected and the solvents are completely removed under reduced pressure to produce monomer M1.

Scheme 1

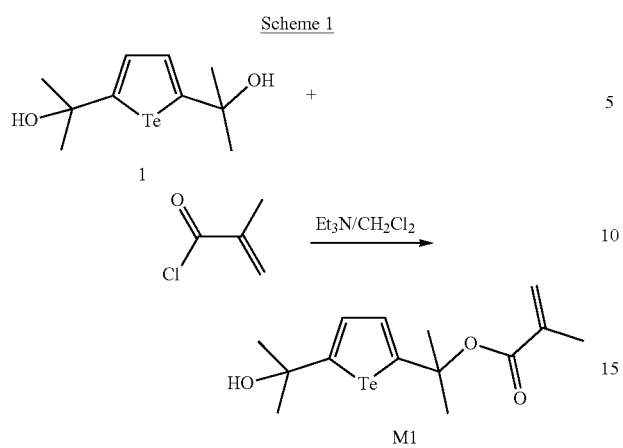

M1

Example 2: M2 Synthesis

The reactions steps for the synthesis of monomer compound M2 is shown in Scheme 2 below. The synthesis of bis(4-hydroxyphenyl) telluride (2) is described by S. Zhang et al, Tetrahedron Letters, 54(20), 2452-2454; 2013. The synthesis of 1-Ethylcyclopentyl bromoacetate (3) is decribed in US 20140080062 by Thackeray, James W. et al. To a solution of compound 2 (10.0 g, 31.80 mmol) in 75 mL N,N-dimethylforamide is added chloroacetic acid tert-butyl ester (6.0 g, 31.50 mmol) and 4.40 g of potassium carbonate. The mixture is stirred under inert atmosphere at 80° C. for 6 hours, cooled to room temperature and poured into 150 mL of water to produce a residue the comprises a mixture of the desired product 4 and other organic components. Product 4 is separated from other components by column chromatography. In the next step, a reaction flask is charged with a solution of compound 4 (10.0 g. 21.36 mmol) in 50 mL of methylene chloride. The solution is cooled to 0° C. Methacryloyl chloride (2.23 g, 21.36 mmol) and triethylamine (2.5 g, 24.7 mmol) are added to the reaction flask, and the mixture is stirred at room temperature for 16 h. The organic phase is washed with water (3×75 mL), and the solvent is completely removed under reduced pressure. The crude material is purified by silica-gel column chromatography. The solvent fractions that contain the product are collected and the solvents are completely removed under reduced pressure to produce monomer M2.

Scheme 2

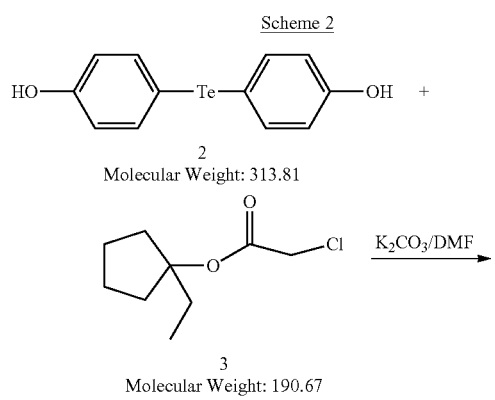

-continued

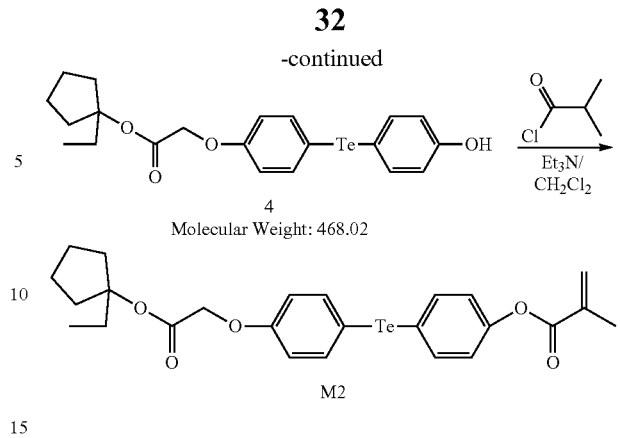

M2

Example 3: M3 Synthesis

The reactions steps for the synthesis of monomer compound M3 is shown in Scheme 3 below. A reaction flask is charged with a solution compound 2 (10.0 g. 31.86 mmol) in 50 mL of methylene chloride. The solution was cooled to 0° C. Methacryloyl chloride (3.32 g, 31.86 mmol) and triethylamine (2.5 g, 24.7 mmol) are added to the reaction flask, and the mixture are stirred at room temperature for 16 h. The organic phase are washed with water (3×75 mL), and the solvent is completely removed under reduced pressure. The crude material is purified by silica-gel column chromatography. The solvent fractions that contain the product are collected and the solvents are completely removed under reduced pressure to produce monomer M3.

Scheme 3

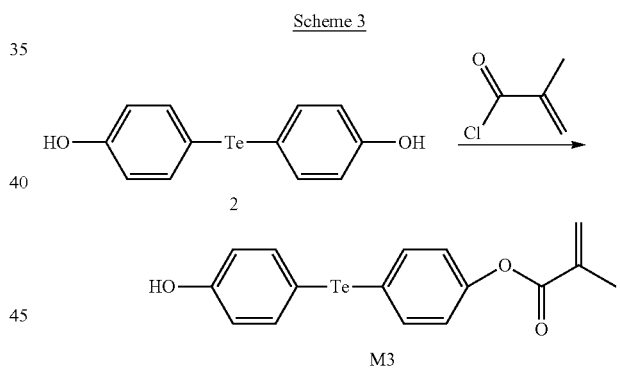

M3

Example 4: Polymer Syntheses

This example describes the synthesis of inventive and comparative copolymers. The molar ratio of the monomers used in the synthesis of each polymer are set forth in Table 1 below. The structures of the monomers are shown in Scheme 4 below. The following procedure is used for the synthesis of polymer 1 (P1). A mixture of monomer MAMA (10.16 g, 0.058 mol), monomer aGBLMA (8.31 g, 0.066 mol) % and monomer HAMA (5.17 g, 0.022 mol) in 48 g propylene glycol monomethyl ether acetate ("PGMEA") and the initiator azo initiator dimethyl 2,2'-azobis(2-methylpropionate) (2.5 g) is heated under nitrogen atmosphere for 8 hours. The reaction is cooled to room temperature and poured into methanol to produce polymer P1 which is filtered and dried.

The additional polymers (P2, P3, P4, P5) set forth in Table 1 below are prepared using the similar procedure used to make copolymer 1 (P1), except using the monomer types and molar feed ratios as specified in Table 1.

Scheme 4

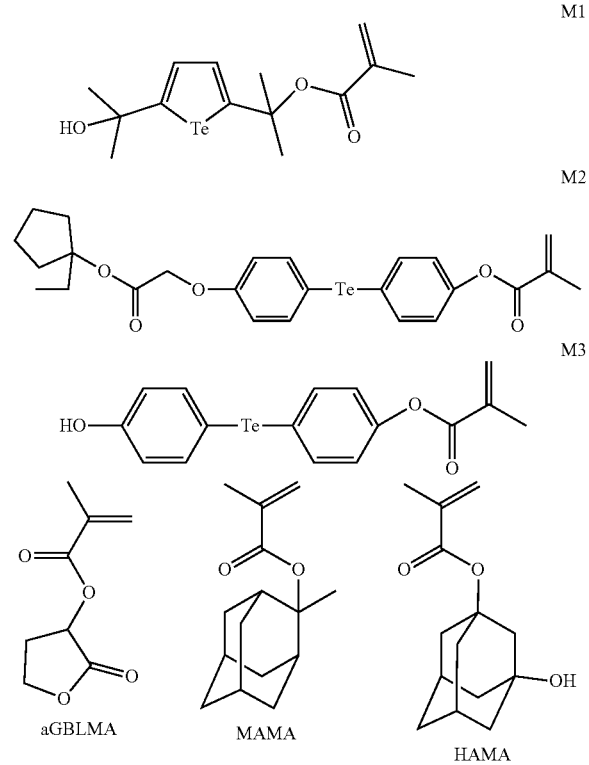

Example 5: Photoresist Composition Preparation

General procedure of photoresist preparation for PTD (positive-tone development) application. A 38.85 g of polymer solution (15% in PGMEA of a polymer such as P2, P3, P4 or P5 described in Example 4 above), 31.04 g of triphenylsulfonium triflate (TPS Tf) (2% in methyl-2-hydroxyisobutyrate), and 5.03 g of tert-butyl (1,3-dihydroxy-2-(hydroxymethyl)propan-2-yl)carbamate solution (1% in methyl-2-hydroxyisobutyrate) are mixed and filtered with a nylon filter to provide a photoresist composition.

Example 6: Underlayer Composition 0.14 g of the polymer P1 described in Example 4 above, 0.012 g of a tetra methoxy methyl glycoluril as a crosslinker, 0.002 g of 2,4,6-Trimethylpyridinium p-toluenesulfonate salt, are dissolved in 82 g of methyl-2-hydroxy isobutyrate solvent to obtain a fluid underlayer coating composition. The prepared fluid composition is filtered through a PTFE molecular weight polyethylene membrane filter. The filtered underlayer coating composition is then spin coated on a silicon wafer at 1500 rpm using a and the thus coated wafer heated at 205° C. for 1 minute on a hot plate.

Example 7: Lithographic Processing

A photoresist composition as prepared in Example 5 is spin coated over a hardened organic coating on a 300 mm silicon wafer followed by a soft bake of 100° C. for 60 seconds. The resist coating layer is exposed to patterned EUV radiation through a mask. The exposed wafer is baked at 100° C. for 60 seconds and the resist layer developed in 2.38% of tetra methyl ammonium hydroxide (TMAH) to provide a relief image.

Example 8: Further Lithographic Processing

A photoresist composition as prepared in Example 5 is spin coated over the baked coating layer as prepared in Example 6 followed by a soft bake of 100° C. for 60 seconds. The resist coating layer is exposed to patterned EUV radiation through a mask. The exposed wafer is baked at 100° C. for 60 seconds and the resist layer developed in 2.38% of tetra methyl ammonium hydroxide (TMAH) to provide a relief image.

Example 9: EUV Transmission Calculations

Table 2 below shows the makeup of a comparative and inventive compositions that each comprise a polymer and the photoacid generator triphenylsulfonium triflate (TPS Tf) at 20% wt. The inventive compositions C2, C3, C4 and C5 comprise inventive polymers P2, P3, P4 and P5 respectively. The transmissions at EUV exposure (13.5 nm) for films made from composition examples were calculated from the Center for X-Ray Optics at Lawrence Berkeley National Laboratory web site by inputting the calculated composition molecular formula and assuming film density of 1.20 g/cm$^3$ and film thickness of 60 nm. As can be seen from Table 2, less transmission is obtained for formulations that comprise the inventive examples. These data confirms the significant increase in PAG absorption for tellurium-containing polymers.

TABLE 1

| Copolymer | Unit 1 (mole %) | Unit 2 (mole %) | Unit 3 (mole %) |
|---|---|---|---|
| P1 (comparative) | MAMA (40) | α-GBLMA (45) | HAMA (15) |
| P2 | M1 (40) | α-GBLMA (45) | HAMA (15) |
| P3 | M2 (40) | α-GBLMA (45) | HAMA (15) |
| P4 | MAMA (40) | α-GBLMA (45) | M3 (15) |
| P5 | M1 (40) | α-GBLMA (45) | M3 (15) |

TABLE 2

| Composition | Polymer | PAG (% wt) | 13.5 nm % Transmittance (FT = 60 nm) |
|---|---|---|---|
| C1 comparative | P1 | TPS Tf | 74.76 |
| C2 | P2 | TPS Tf | 67.95 |
| C3 | P3 | TPS Tf | 69.42 |
| C4 | P4 | TPS Tf | 72.18 |
| C5 | P5 | TPS Tf | 61.80 |

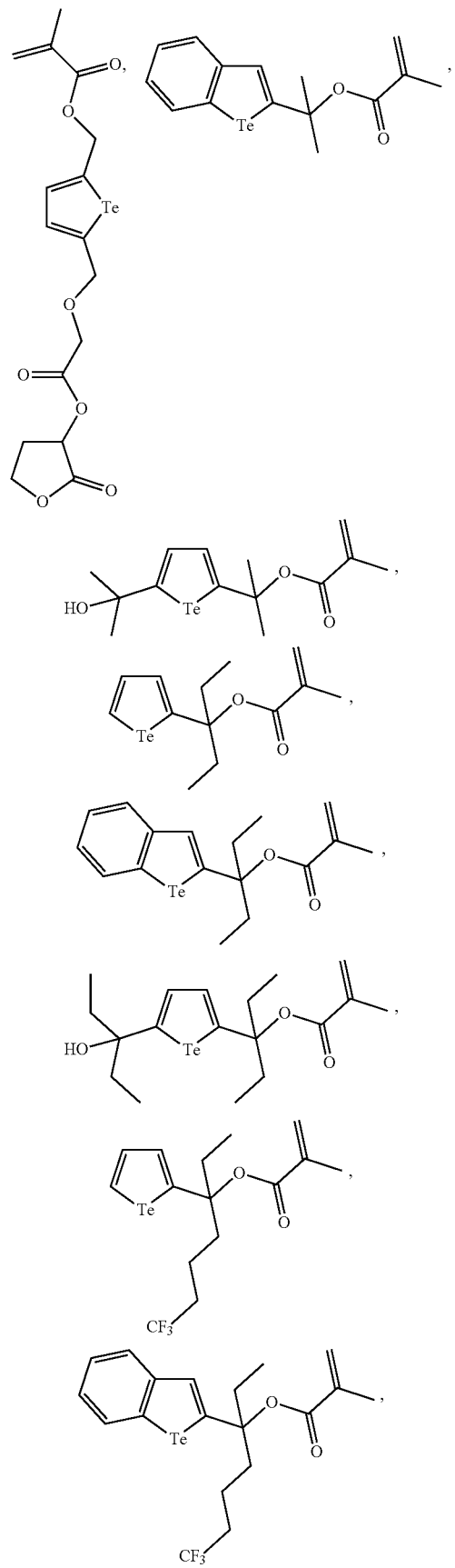

-continued
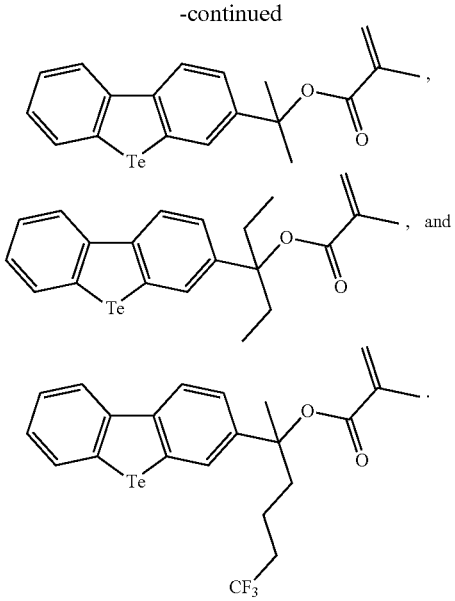

What is claimed is:

1. A method for providing a photoresist relief image comprising:
   a) applying a coating layer of a photoresist composition on a substrate; and
   b) exposing the photoresist composition layer to activating radiation and developing the exposed photoresist composition layer,
   wherein: the photoresist composition comprises:
      i) one or more polymers that comprise repeating units formed by the polymerization of a tellurium-containing monomer: wherein the tellurium containing monomer
         repeating units formed by the polymerization of a tellurium-containing monomer: wherein the tellurium containing monomer comprises a tellurophene heterocycle and one or more ethylenically polymerizable groups, or
         the tellurium-containing monomer is of Formula (IIIC); and
      ii) one or more acid generator compounds

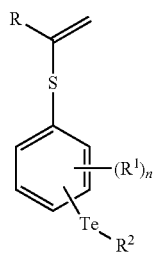
(IIIC)

wherein,
   R is hydrogen or an optionally substituted $C_{1-16}$ alkyl;
   S is a chemical bond or a chain having from 1 to 20 carbon and oxygen atoms that are optionally substituted;
   each $R^1$ is the same or different non-hydrogen substituent;
   $R^2$ is a non-hydrogen substituent; and
   n is an integer of 0 to 4,
   wherein the tellurium-containing monomer of Formula (IIIC) further comprises one or more acid-cleavable groups.

2. The method of claim 1, wherein the tellurium-containing monomer comprises one or more optionally substituted acrylate moiety, optionally substituted acrylamide moiety, optionally substituted vinyl ether moiety or a cyclic olefin moiety.

3. The method of claim 1, wherein the tellurium-containing monomer comprises one more optionally substituted methacrylate, fluoromethacrylate, cyanoacrylate, methylacrylamide, vinyl ether, norbornyl acrylate moiety, optionally substituted acrylamide moiety, optionally substituted lactone, optionally substituted vinyl ether moiety or a cyclic olefin moiety.

4. The method of claim 1 wherein the tellurium-containing monomer comprises one or more alkyl, fluoroalkyl, carbocyclic aryl, heteroaryl, sulfonic ester or sulfonamide.

5. The method of claim 1, wherein the tellurium-containing monomer is selected from:

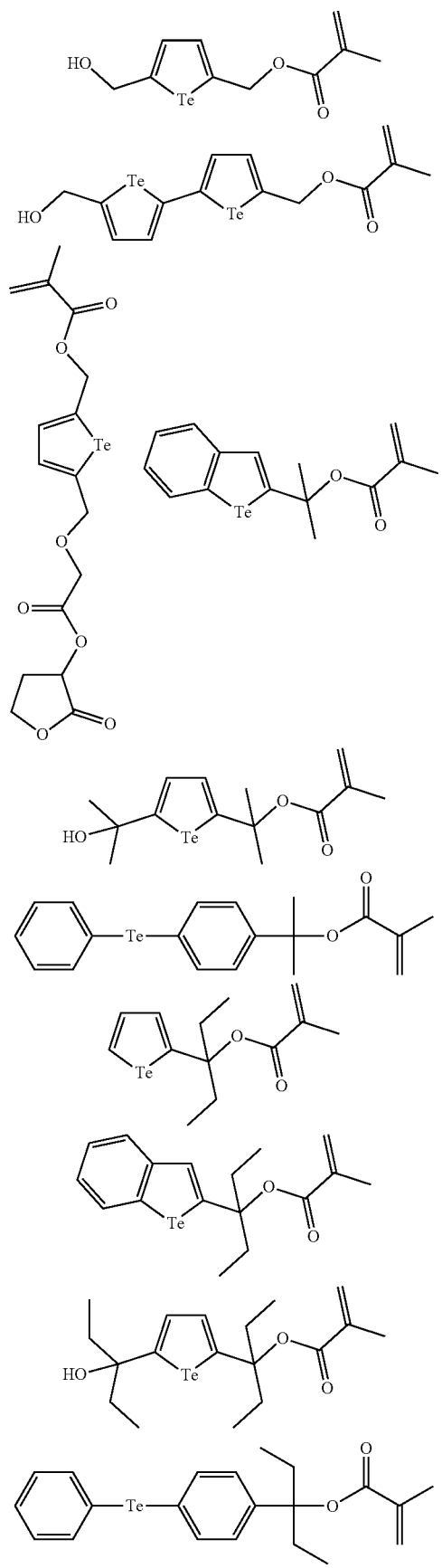

-continued
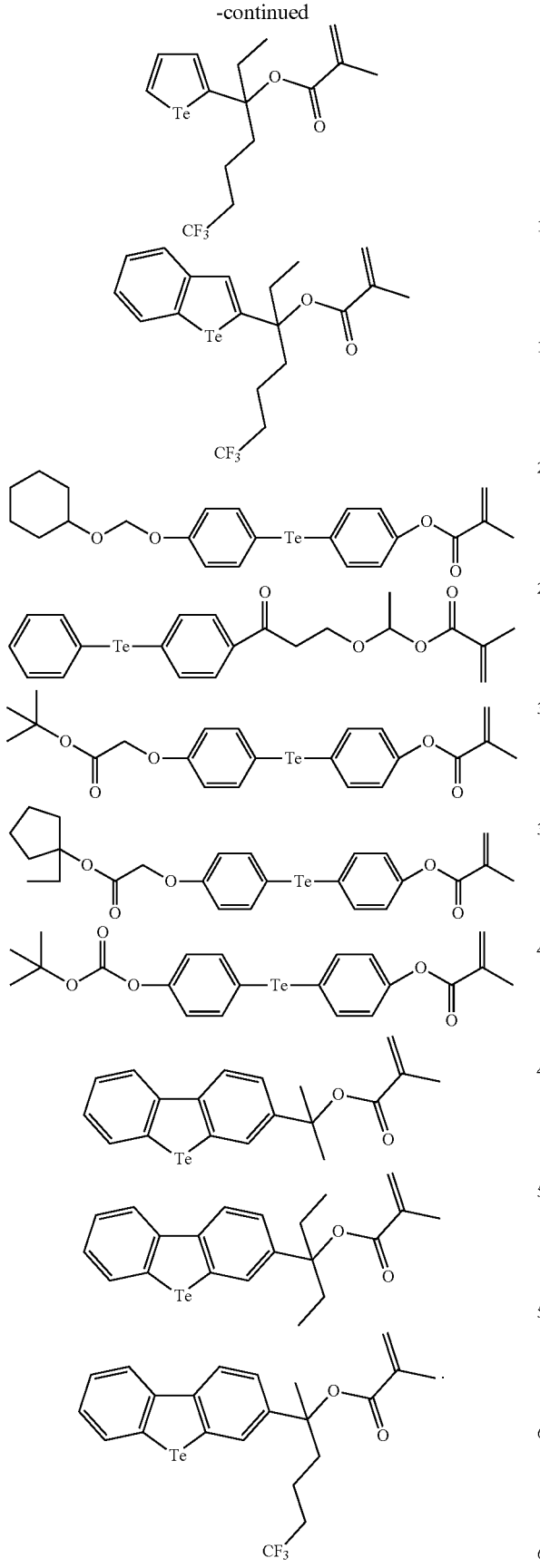
6. The method of claim 1, wherein the tellurium-containing monomer is selected from the group consisting of:
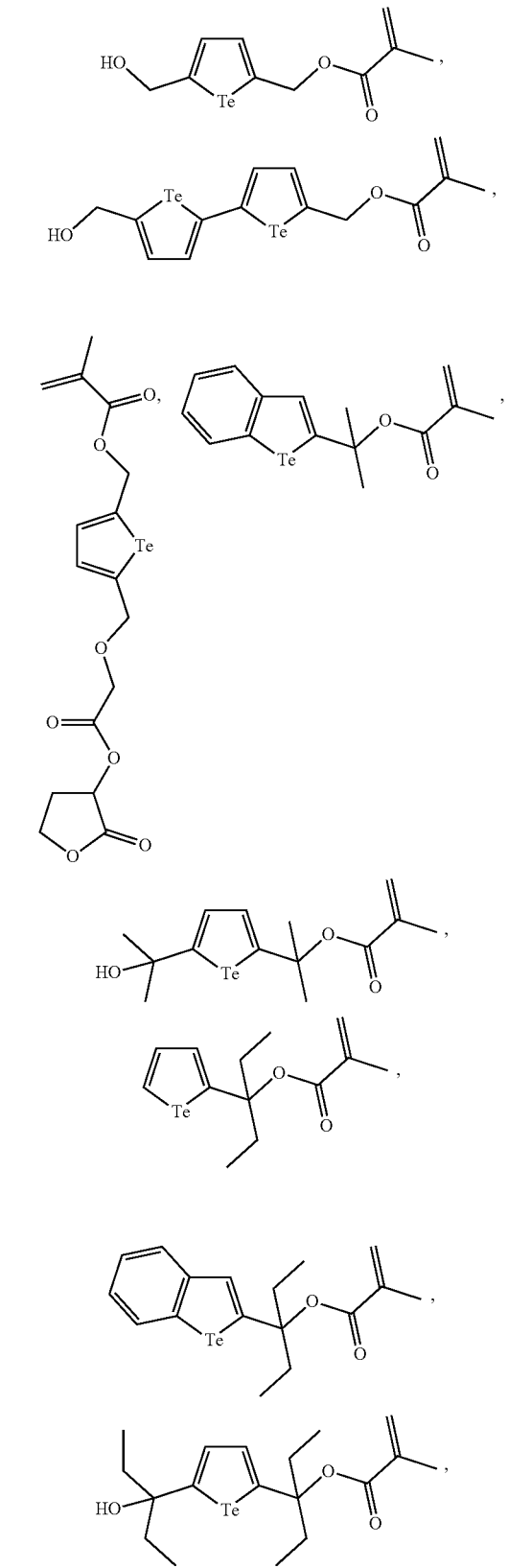

-continued

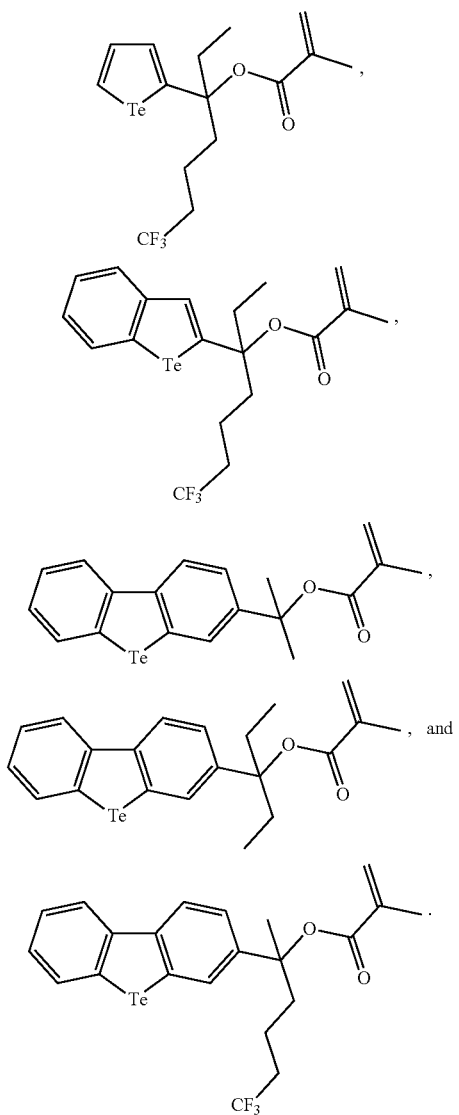

7. A method for providing a photoresist relief image, comprising:
a) applying a layer of an underlayer coating composition on a substrate;
b) applying a layer of a photoresist composition above the underlayer coating composition layer, wherein the underlayer coating composition and the photoresist composition are different; and
c) exposing the photoresist composition layer to activating radiation and developing the exposed photoresist composition layer,
wherein the underlayer coating composition comprises:
one or more polymers that comprise repeating units formed by the polymerization of a tellurium-containing monomer: wherein the tellurium containing monomer repeating units formed by the polymerization of a tellurium-containing monomer: wherein the tellurium containing monomer comprises a tellurophene heterocycle and one or more ethylenically polymerizable groups, or the tellurium-containing monomer is of Formula (IIIC);

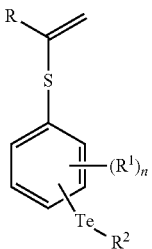

wherein,
R is hydrogen or an optionally substituted $C_{1-16}$ alkyl;
S is a chemical bond or a chain having from 1 to 20 carbon and oxygen atoms that are optionally substituted;
each $R^1$ is the same or different non-hydrogen substituent;
$R^2$ is a non-hydrogen substituent; and
n is an integer of 0 to 4.

8. The method of claim 7, wherein the tellurium-containing monomer further comprises one or more acid-cleavable groups, polar groups and/or base reactive groups.

9. The method of claim 7, wherein tellurium-containing monomer comprises one or more optionally substituted acrylate moiety, optionally substituted acrylamide moiety, optionally substituted vinyl ether moiety or a cyclic olefin moiety.

10. The method of claim 7, wherein the tellurium-containing monomer comprises one more optionally substituted methacrylate, fluoromethacrylate, cyanoacrylate, methylacrylamide, vinyl ether, norbornyl acrylate moiety, optionally substituted acrylamide moiety, optionally substituted lactone, optionally substituted vinyl ether moiety or a cyclic olefin moiety.

11. The method of claim 7 wherein the tellurium-containing monomer comprises one or more of alkyl, fluoroalkyl, carbocyclic aryl, heteroaryl, sulfonic ester or sulfonamide.

12. The method of claim 7 wherein the tellurium monomer is selected from among:

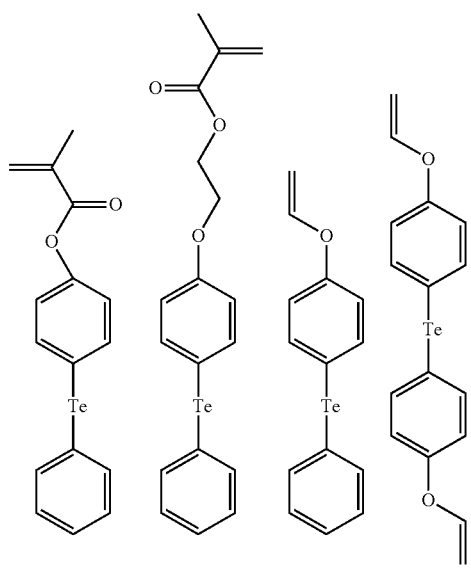

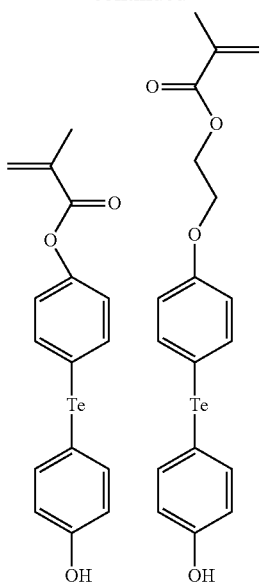
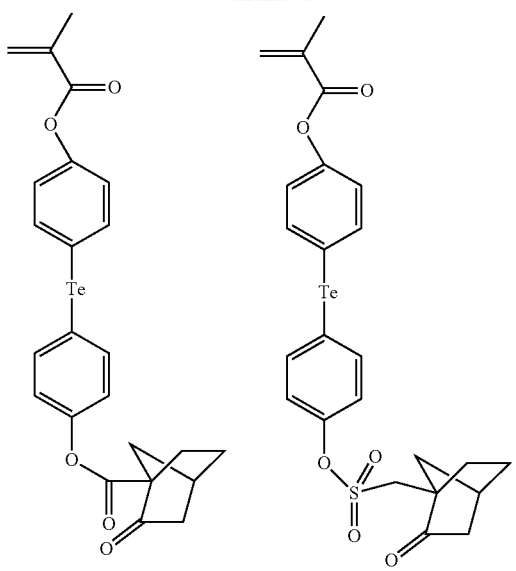
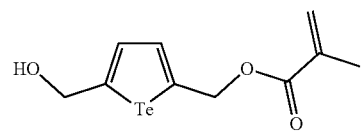
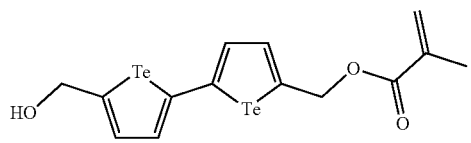
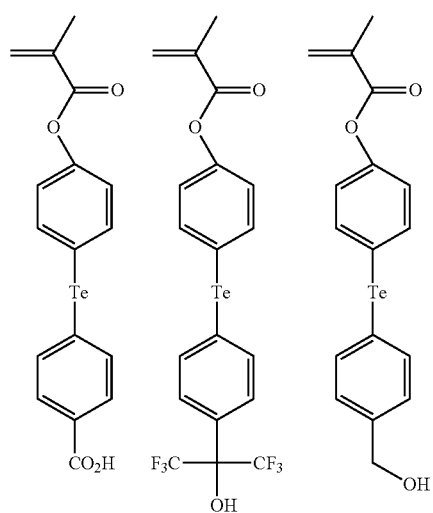
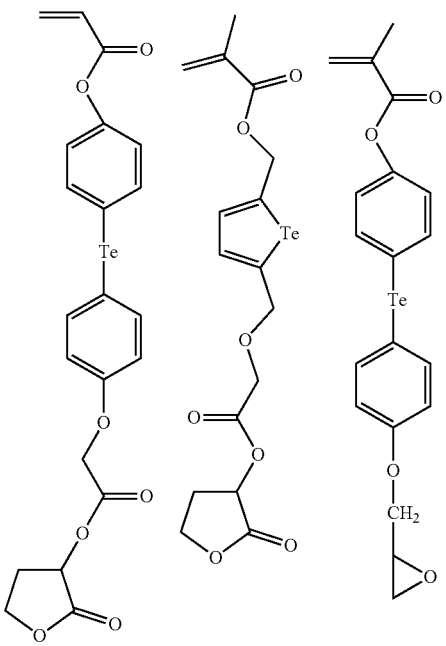

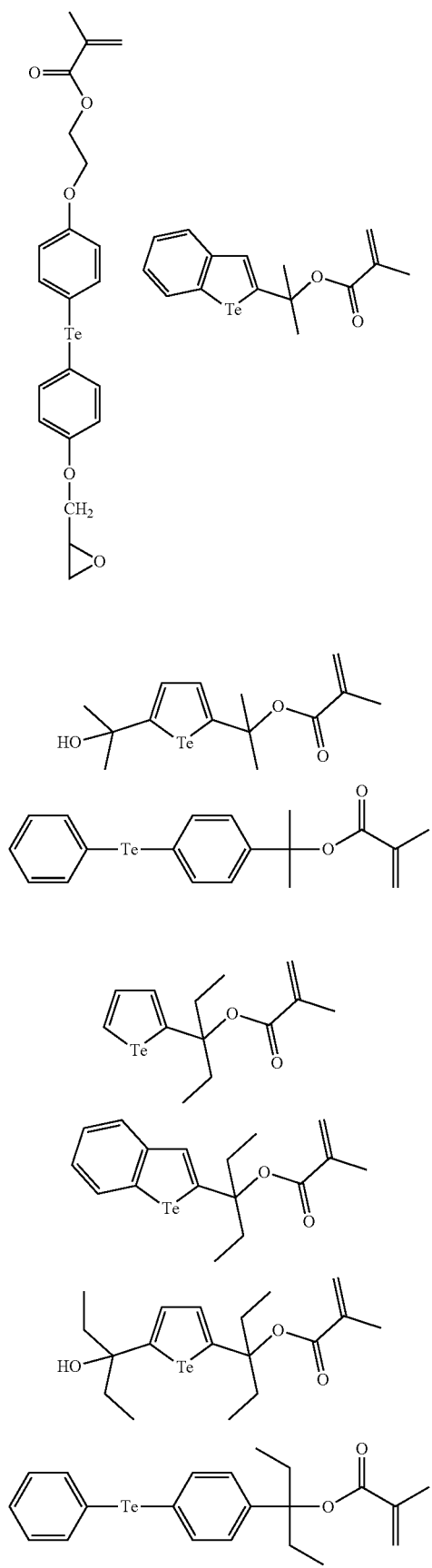
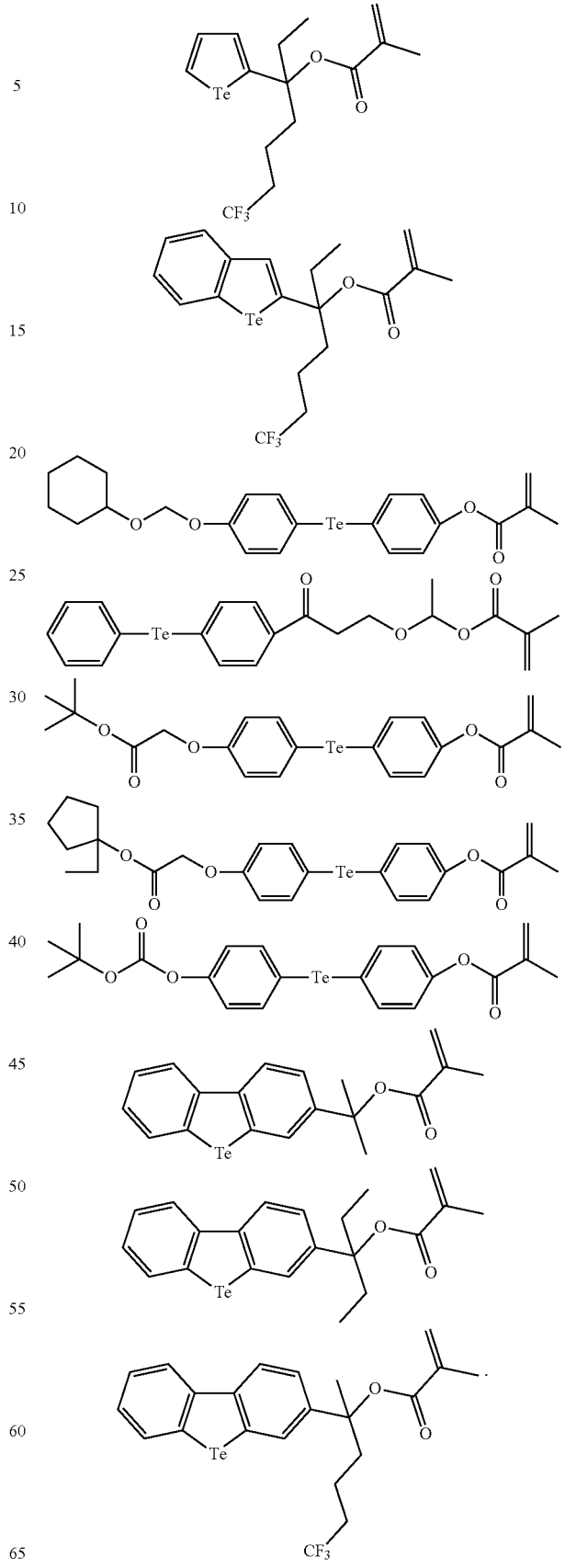

13. The method of claim 7, wherein the monomer is selected from the group consisting of:

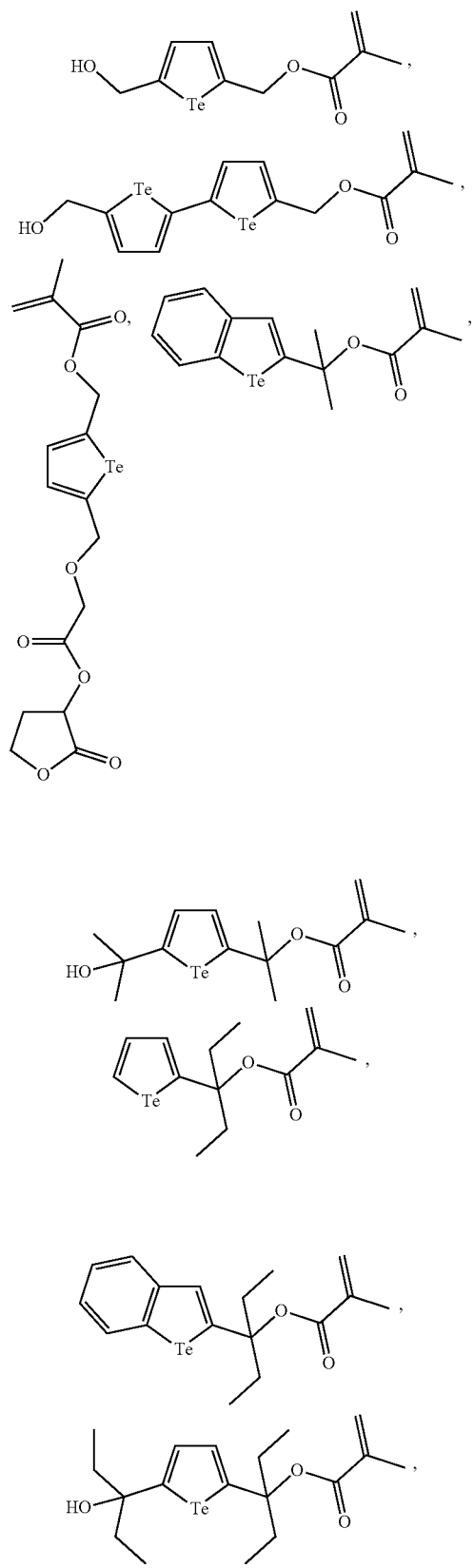

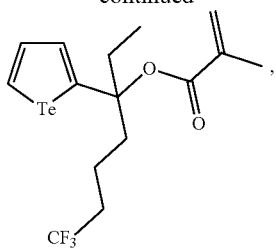

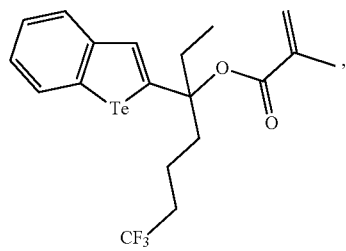

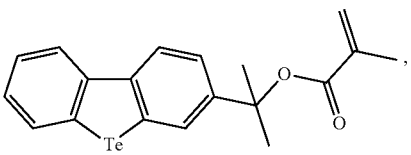

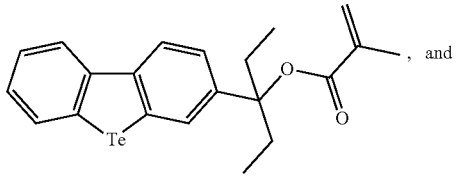

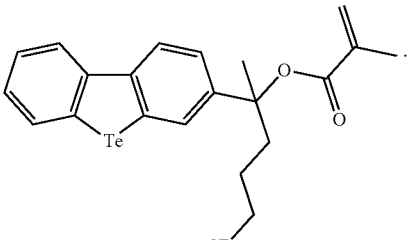

, and

14. A photoresist composition, comprising:
one or more polymers comprising repeating units formed by the polymerization of a tellurium-containing monomer: wherein the tellurium containing monomer
repeating units formed by the polymerization of a tellurium-containing monomer: wherein the tellurium containing monomer that comprises a tellurophene heterocycle and one or more ethylenically polymerizable groups, or the tellurium-containing monomer is of Formula (IIIC); and one or more acid generator compounds,

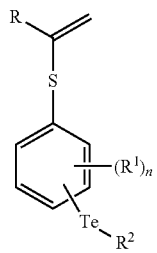
(IIIC)

wherein,
R is hydrogen or an optionally substituted $C_{1-16}$ alkyl;
S is a linker;
each $R^1$ is the same or different non-hydrogen substituent;
$R^2$ is a non-hydrogen substituent; and
n is an integer of 0 to 4;
wherein the tellurium-containing monomer represented by the formula (IIIC) comprises one or more acid-cleavable groups.

15. The photoresist of claim 14, wherein the tellurium-containing monomer further comprises one or more polar groups, base reactive groups, or a combination thereof.

16. A method for providing a photoresist relief image, the method comprising:
applying a coating layer of a photoresist composition of claim 14 on a substrate; and
exposing the coating layer to activating radiation and developing the exposed coating layer.

17. The photoresist composition of claim 14, wherein the tellurium-containing monomer is selected from the group consisting of:

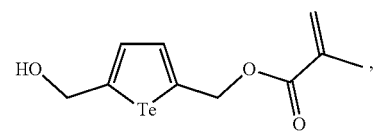

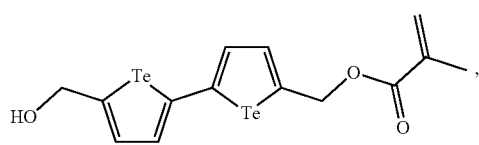

-continued